(12) United States Patent
Guo et al.

(10) Patent No.: US 11,041,717 B2
(45) Date of Patent: Jun. 22, 2021

(54) ANALYTICAL METHOD OF DETERMINING THE SOLUTION OF AN OBJECT WITH EDGES UNDER APPLIED LOAD

(71) Applicant: City University of Hong Kong, Kowloon (HK)

(72) Inventors: Liang Guo, Qufu (CN); Zhiming Zhang, Shanghai (CN); Wen Wang, Shanghai (CN); Pat Lam Patrick Wong, Kowloon (HK)

(73) Assignee: City University of Hong Kong, Kowloon (HK)

( * ) Notice: Subject to any disclaimer, the term of this patent is extended or adjusted under 35 U.S.C. 154(b) by 351 days.

(21) Appl. No.: 15/875,294

(22) Filed: Jan. 19, 2018

(65) Prior Publication Data
US 2019/0226840 A1 Jul. 25, 2019

(51) Int. Cl.
*G01B 21/32* (2006.01)
*G06F 17/16* (2006.01)
*G01L 1/00* (2006.01)
*G06F 30/00* (2020.01)

(52) U.S. Cl.
CPC .............. *G01B 21/32* (2013.01); *G01L 1/005* (2013.01); *G06F 17/16* (2013.01); *G06F 30/00* (2020.01)

(58) Field of Classification Search
None
See application file for complete search history.

(56) References Cited

U.S. PATENT DOCUMENTS 9,459,173 B2 * 10/2016 White .................. A61B 5/1036
2008/0005049 A1 * 1/2008 Wheeler ............ G06K 9/00335
706/19

OTHER PUBLICATIONS

Li et al. "Improved workpiece location accuracy through fixture layout optimization" International Journal of Machine Tools & Manufacture 39 (1999), 871-883. (Year: 1999).*
MANE 4220 and CIVL 4240 Introduction to Finite Elements "Introduction to 3D Elasticity" (Year: 2008).*

* cited by examiner

*Primary Examiner* — Roy Y Yi
(74) *Attorney, Agent, or Firm* — Renner Kenner Greive Bobak Taylor & Weber

(57) ABSTRACT

An analytical method of determining the solution of an object with a plurality of planar surfaces under applied load includes the steps of assigning the load applied on each of the plurality of planar surfaces in the three dimensional directions respectively, determining the equivalent load applied on each of the plurality of planar surfaces in the three dimensional directions from the applied loads with the stress boundary conditions, and determining the stress and strain fields from the equivalent load applied on each of the plurality of planar surfaces.

16 Claims, 13 Drawing Sheets

ANALYTICAL METHOD OF DETERMINING THE SOLUTION OF AN OBJECT WITH EDGES UNDER APPLIED LOAD

TECHNICAL FIELD

The present invention relates to an analytical method of determining the solution (deformation and stress) of an object, and particularly, although not exclusively, to an analytical method of determining the deformation and stress of an object with a plurality of planar surfaces under applied load.

BACKGROUND

Contact mechanics is of particular importance in determining the physical behaviour of a mechanical component such as rail-wheel systems, roller bearings, and cutting tools, where the contact or loaded areas of these components are not far from the edge surface of the contact bodies.

In such situations, the edge surface may affect the internal stress and strain fields, and thus it is impossible to obtain accurate analytical solutions using classical contact mechanic formulae which are derived based on the assumption that the loaded object is an elastic half-space.

SUMMARY OF THE INVENTION

In accordance with a first aspect of the present invention, there is provided an analytical method of determining the solution of an object with a plurality of planar surfaces under applied load, comprising the steps of:

A. assigning the load applied on each of the plurality of planar surfaces in the three dimensional directions respectively; and B. determining the equivalent load applied on each of the plurality of planar surfaces in the three dimensional directions from the applied load with the stress boundary conditions.

C. determining the stress and strain fields from the equivalent load applied on each of the plurality of planar surfaces.

In an embodiment of the first aspect, each of the plurality of planar surfaces is divided into a plurality of uniformly loaded sections each having a centre respectively.

In an embodiment of the first aspect, the applied load includes the accumulation of uniform loads applied on each uniformly loaded section.

In an embodiment of the first aspect, the equivalent load includes the accumulation of uniform equivalent loads applied on each uniformly loaded section.

In an embodiment of the first aspect, the induced stress includes the accumulation of stresses induced on the centre of each uniformly loaded section.

In an embodiment of the first aspect, each centre of the uniformly loaded sections on the plurality of planar surfaces $X_1$-$Y_1$ and $X_2$-$Y_2$ is represented by $x_{1i}$, $y_{1i}$ and $x_{2j}$, $y_{2j}$ respectively.

In an embodiment of the first aspect, the parameter of the applied load applied on each of the plurality of planar surfaces $X_1$-$Y_1$ and $X_2$-$Y_2$ are represented by $P_1$, $Q_{X1}$, $Q_{Y1}$ and $P_2$, $Q_{X2}$, $Q_{Y2}$ respectively.

In an embodiment of the first aspect, $P_1$, $Q_{X1}$, $Q_{Y1}$ and $P_2$, $Q_{X2}$, $Q_{Y2}$ are each represented in the form of the accumulation of uniform loads applied on each uniformly loaded section by the following expression respectively:

$$P_1 = \begin{bmatrix} (p_1)_1 \\ (p_1)_2 \\ \vdots \\ (p_1)_k \end{bmatrix}; Q_{X1} = \begin{bmatrix} (q_{x1})_1 \\ (q_{x1})_2 \\ \vdots \\ (q_{x1})_k \end{bmatrix}; Q_{Y1} = \begin{bmatrix} (q_{y1})_1 \\ (q_{y1})_2 \\ \vdots \\ (q_{y1})_k \end{bmatrix}$$

$$P_2 = \begin{bmatrix} (p_2)_1 \\ (p_2)_2 \\ \vdots \\ (p_2)_l \end{bmatrix}; Q_{X2} = \begin{bmatrix} (q_{x2})_1 \\ (q_{x2})_2 \\ \vdots \\ (q_{x2})_l \end{bmatrix}; Q_{Y2} = \begin{bmatrix} (q_{y2})_1 \\ (q_{y2})_2 \\ \vdots \\ (q_{y2})_l \end{bmatrix}$$

where
$(p_1)_i = p_1(x_{1i}, y_{1i})$, $(q_{x1})_i = q_{x1}(x_{1i}, y_{1i})$, $(q_{y1})_i = q_{y1}(x_{1i}, y_{1i})$; and
$(p_2)_j = p_2(x_{2j}, y_{2j})$, $(q_{x2})_j = q_{x2}(x_{2j}, y_{2j})$, $(q_{y2})_j = q_{y2}(x_{2j}, y_{2j})$.

In an embodiment of the first aspect, the parameter of the equivalent load applied on the plurality of planar surfaces $X_1$-$Y_1$ and $X_2$-$Y_2$ are each represented by $\overline{P}_1$, $\overline{Q}_{X1}$, $\overline{Q}_{Y1}$ and $\overline{P}_2$, $\overline{Q}_{X2}$, $\overline{Q}_{Y2}$ respectively.

In an embodiment of the first aspect, $\overline{P}_1$, $\overline{Q}_{X1}$, $\overline{Q}_{Y1}$ and $\overline{P}_2$, $\overline{Q}_{X2}$, $\overline{Q}_{Y2}$ are each represented in the form of the accumulation of uniform equivalent loads applied on each uniformly loaded section by the following expression respectively:

$$\overline{P}_1 = \begin{bmatrix} (\overline{p}_1)_1 \\ (\overline{p}_1)_2 \\ \vdots \\ (\overline{p}_1)_k \end{bmatrix}; \overline{Q}_{X1} = \begin{bmatrix} (\overline{q}_{x1})_1 \\ (\overline{q}_{x1})_2 \\ \vdots \\ (\overline{q}_{x1})_k \end{bmatrix}; \overline{Q}_{Y1} = \begin{bmatrix} (\overline{q}_{y1})_1 \\ (\overline{q}_{y1})_2 \\ \vdots \\ (\overline{q}_{y1})_k \end{bmatrix}$$

$$\overline{P}_2 = \begin{bmatrix} (\overline{p}_2)_1 \\ (\overline{p}_2)_2 \\ \vdots \\ (\overline{p}_2)_l \end{bmatrix}; \overline{Q}_{X2} = \begin{bmatrix} (\overline{q}_{x2})_1 \\ (\overline{q}_{x2})_2 \\ \vdots \\ (\overline{q}_{x2})_l \end{bmatrix}; \overline{Q}_{Y2} = \begin{bmatrix} (\overline{q}_{y2})_1 \\ (\overline{q}_{y2})_2 \\ \vdots \\ (\overline{q}_{y2})_l \end{bmatrix}$$

where
$(\overline{p}_1)_i = \overline{p}_1(x_{1i}, y_{1i})$, $(\overline{q}_{x1})_i = \overline{q}_{x1}(x_{1i}, y_{1i})$, $(\overline{q}_{y1})_i = \overline{q}_{y1}(x_{1i}, y_{1i})$; and
$(\overline{p}_2)_j = \overline{p}_2(x_{2j}, y_{2j})$, $(\overline{q}_{x2})_j = \overline{q}_{x2}(x_{2j}, y_{2j})$, $(\overline{q}_{y2})_j = \overline{q}_{y2}(x_{2j}, y_{2j})$.

In an embodiment of the first aspect, the parameter of the induced stress induced by the equivalent load on the plurality of planar surfaces $X_2$-$Y_2$ and $X_1$-$Y_1$ are each represented by $S_Z$, $S_X$, $S_Y$ and $T_X$, $T_X$, $T_Y$ respectively.

In an embodiment of the first aspect, $S_Z$, $S_X$, $S_Y$ and $T_Z$, $T_X$, $T_Y$ are each represented in the form of the accumulation of stresses induced on the centre of each uniformly loaded section by the following expression respectively:

$$S_Z = \begin{bmatrix} (\sigma_{zz2})_1 \\ (\sigma_{zz2})_2 \\ \vdots \\ (\sigma_{zz2})_l \end{bmatrix}; S_X = \begin{bmatrix} (\tau_{zx2})_1 \\ (\tau_{zx2})_2 \\ \vdots \\ (\tau_{zx2})_l \end{bmatrix}; S_Y = \begin{bmatrix} (\tau_{zy2})_1 \\ (\tau_{zy2})_2 \\ \vdots \\ (\tau_{zy2})_l \end{bmatrix}$$

$$T_Z = \begin{bmatrix} (\sigma_{zz1})_1 \\ (\sigma_{zz1})_2 \\ \vdots \\ (\sigma_{zz1})_k \end{bmatrix}; T_X = \begin{bmatrix} (\tau_{zx1})_1 \\ (\tau_{zx1})_2 \\ \vdots \\ (\tau_{zx1})_k \end{bmatrix}; T_Y = \begin{bmatrix} (\tau_{zy1})_1 \\ (\tau_{zy1})_2 \\ \vdots \\ (\tau_{zy1})_k \end{bmatrix}$$

where
$(\sigma_{zz2})_j = \sigma_{zz2}(x_{2j}, y_{2j})$, $(\tau_{zx2})_j = \tau_{zx2}(x_{2j}, y_{2j})$, $(\tau_{zy2})_j = \tau_{zy2}(x_{2j}, y_{2j})$; and $(\sigma_{zz1})_i = \sigma_{zz1}(x_{1i}, y_{1i})$, $(\tau_{zx1})_i = \tau_{zx1}(x_{1i}, y_{1i})$, $(\tau_{xy1})_i = \tau_{zy1}(x_{1i}, y_{1i})$.

In an embodiment of the first aspect, the stresses $(\sigma_{zz2})_j$, $(\tau_{zx2})_j$, $(\tau_{zy2})_j$ on the centre of the jth uniformly loaded section on planar surface $X_2$-$Y_2$ by equivalent loads $(\bar{p}_1)_i$, $(\bar{q}_{x1})_i$, $(\bar{q}_{y1})_i$ on the centre of the uniformly loaded section ith on planar surface $X_1$-$Y_1$ are determined by the following expression:

$$\sigma_{zz2}(x_{2j},y_{2j}) = m_{zzij}\bar{p}_1(x_{1i},y_{1i}) + m_{zxij}\bar{q}_{x1}(x_{1i},y_{1i}) + m_{zyij}\bar{q}_{y1}(x_{1i},y_{1i})$$

$$\tau_{xz2}(x_{2j},y_{2j}) = m_{xzij}\bar{p}_1(x_{1i},y_{1i}) + m_{xxij}\bar{q}_{x1}(x_{1i},y_{1i}) + m_{xyij}\bar{q}_{y1}(x_{1i},y_{1i})$$

$$\tau_{zy2}(x_{2j},y_{2j}) = m_{yzij}\bar{p}_1(x_{1i},y_{1i}) + m_{yxij}\bar{q}_{x1}(x_{1i},y_{1i}) + m_{yyij}\bar{q}_{y1}(x_{1i},y_{1i})$$

In an embodiment of the first aspect, the stresses $(\sigma_{zz1})_i$, $(\sigma_{zx1})_i$, $(\sigma_{zy1})_i$ on the centre of the ith uniformly loaded section on planar surface $X_1$-$Y_1$ by equivalent loads $(\bar{p}_2)_j$, $(\bar{q}_{x2})_j$, $(\bar{q}_{y2})_j$ on the centre of the jth uniformly loaded section on planar surface $X_2$-$Y_2$ are determined by the following expression:

$$\sigma_{zz1}(x_{1i},y_{1i}) = n_{zxji}\bar{p}_2(x_{2j},y_{2j}) + n_{zxji}\bar{q}_{x2}(x_{2j},y_{2j}) + n_{zyji}\bar{q}_{y2}(x_{2j},y_{2j})$$

$$\tau_{zx1}(x_{1i},y_{1i}) = n_{xzji}\bar{p}_2(x_{2j},y_{2j}) + n_{xxji}\bar{q}_{x2}(x_{2j},y_{2j}) + n_{xyji}\bar{q}_{y2}(x_{2j},y_{2j})$$

$$\tau_{zy1}(x_{1i},y_{1i}) = n_{yzji}\bar{p}_2(x_{2j},y_{2j}) + n_{yxji}\bar{q}_{x2}(x_{2j},y_{2j}) + n_{yyji}\bar{q}_{y2}(x_{2j},y_{2j})$$

In an embodiment of the first aspect, the coefficients $M_{zz}$, $m_{xz}$, $m_{yz}$ and $n_{zz}$, $n_{xz}$, $n_{yz}$ are determined based on the classical half-space formulae.

In an embodiment of the first aspect, the stress and strain fields induced by the applied load on the plurality of planar surfaces is determined based on the corresponding equivalent load using the classical half-space formulae.

In accordance with a second aspect of the present invention, there is provided an analytical method of determining the solution of an object with a plurality of planar surfaces under applied load, comprising the step of determining a transformation matrix and in turn providing the equivalent load from the original applied-load.

In an embodiment of the second aspect, the transformation matrix is associated with the physical characteristic of a said object.

In an embodiment of the second aspect, the physical characteristic includes the elastic property of a said object and the relative orientations between the planar surfaces.

In an embodiment of the second aspect, the transformation matrix is associated with the size of grids or meshes of the uniformly loaded section.

In an embodiment of the second aspect, the transformation matrix includes the accumulation of coefficients used in the classical formulae for half-space stress and strain calculations.

In an embodiment of the second aspect, the transformation matrix is represented by a plurality of two dimensional coefficients $M_{ZZ}$, $M_{ZX}$, $M_{ZY}$, $M_{XZ}$, $M_{XX}$, $M_{XY}$, $M_{YZ}$, $M_{YX}$, $M_{YY}$ and $N_{ZZ}$, $N_{ZX}$, $N_{ZY}$, $N_{XZ}$, $N_{XX}$, $N_{XY}$, $N_{YZ}$, $N_{YX}$, $N_{YY}$ respectively.

In an embodiment of the second aspect, $M_{ZZ}$, $M_{ZX}$, $M_{ZY}$, $M_{XZ}$, $M_{XX}$, $M_{XY}$, $M_{YZ}$, $M_{YX}$, $M_{YY}$ and $N_{ZZ}$, $N_{ZX}$, $N_{ZY}$, $N_{XZ}$, $N_{XX}$, $N_{XY}$, $N_{YZ}$, $N_{YX}$, $N_{YY}$ are each represented in the form of the accumulation of coefficients of each uniformly loaded section by the following expression respectively:

$$M_{ZZ} = \begin{bmatrix} m_{zz11} & m_{zz21} & \cdots & m_{zzk1} \\ m_{zz12} & m_{zz22} & \cdots & m_{zzk2} \\ \vdots & \vdots & \ddots & \vdots \\ m_{zz1l} & m_{zz2l} & \cdots & m_{zzkl} \end{bmatrix}$$

$$M_{ZX} = \begin{bmatrix} m_{zx11} & m_{zx21} & \cdots & m_{zxk1} \\ m_{zx12} & m_{zx22} & \cdots & m_{zxk2} \\ \vdots & \vdots & \ddots & \vdots \\ m_{zx1l} & m_{zx2l} & \cdots & m_{zxkl} \end{bmatrix}$$

$$\vdots$$

$$M_{YY} = \begin{bmatrix} m_{yy11} & m_{yy21} & \cdots & m_{yyk1} \\ m_{yy12} & m_{yy22} & \cdots & m_{yyk2} \\ \vdots & \vdots & \ddots & \vdots \\ m_{yy1l} & m_{yy2l} & \cdots & m_{yykl} \end{bmatrix}$$

$$N_{ZZ} = \begin{bmatrix} n_{zz11} & n_{zz21} & \cdots & n_{zzl1} \\ n_{zz12} & n_{zz22} & \cdots & n_{zzl2} \\ \vdots & \vdots & \ddots & \vdots \\ n_{zz1k} & n_{zz2k} & \cdots & n_{zzlk} \end{bmatrix}$$

$$N_{ZX} = \begin{bmatrix} n_{zx11} & n_{zx21} & \cdots & n_{zxl1} \\ n_{zx12} & n_{zx22} & \cdots & n_{zxl2} \\ \vdots & \vdots & \ddots & \vdots \\ n_{zx1k} & n_{zx2k} & \cdots & n_{zxlk} \end{bmatrix}$$

$$\vdots$$

$$N_{YY} = \begin{bmatrix} n_{yy11} & n_{yy21} & \cdots & n_{yyl1} \\ n_{yy12} & n_{yy22} & \cdots & n_{yyl2} \\ \vdots & \vdots & \ddots & \vdots \\ n_{yy1k} & n_{yy2k} & \cdots & n_{yylk} \end{bmatrix}$$

In an embodiment of the second aspect, following step B of the first aspect, $\bar{P}_1$, $\bar{Q}_{X1}$, $\bar{Q}_{Y1}$ and $\bar{P}_2$, $\bar{Q}_{X2}$, $\bar{Q}_{Y2}$ are determined from the following expression:

$$\begin{bmatrix} \bar{P}_1 \\ \bar{Q}_{X1} \\ \bar{Q}_{Y1} \\ \bar{P}_2 \\ \bar{Q}_{X2} \\ \bar{Q}_{Y2} \end{bmatrix} = \begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1} \begin{bmatrix} P_1 \\ Q_{X1} \\ Q_{Y1} \\ P_2 \\ Q_{X2} \\ Q_{Y2} \end{bmatrix}$$

where the inverse matrix is the transformation matrix.

In an embodiment of the second aspect, the transformation matrix is represented with the following expression:

$$\begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1}$$

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

The inventors have, through their own research and experiences, devised that enabling the determination of the induced stress and deformation of an object under load is utterly important in engineering. A semi-infinite (termed as half-space in contact mechanics) body can be solved analytically with classical formulae.

However, 3D objects are generally composed of various planar surfaces or cross sections and how they respond to external loads cannot be directly calculated. The use of alternative methods such as the finite element method (FEM) is thus very common in practice. However, high precision FEM results can only be achieved using very fine meshes, which mean very long computational time and exceedingly large memories.

The inventors have developed an algorithm to derive the stress and strain solutions of three-dimensional (3D) objects. Its concept can be illustrated using a simple 3D object, wedge, which is constructed with two planar surfaces. A wedge under applied loads on its two planes is made equivalent to the superposition of two separated half-spaces under equivalent loads. The equivalent loads are directly related to the original applied-loads of the wedge and can be deduced based on the original stress boundary condition of the wedge (being the original loads on its two planes). Knowing the equivalent loads, the stress and strain of the wedge 10 can be determined by using the classical formulae of half-spaces.

Figure 1:
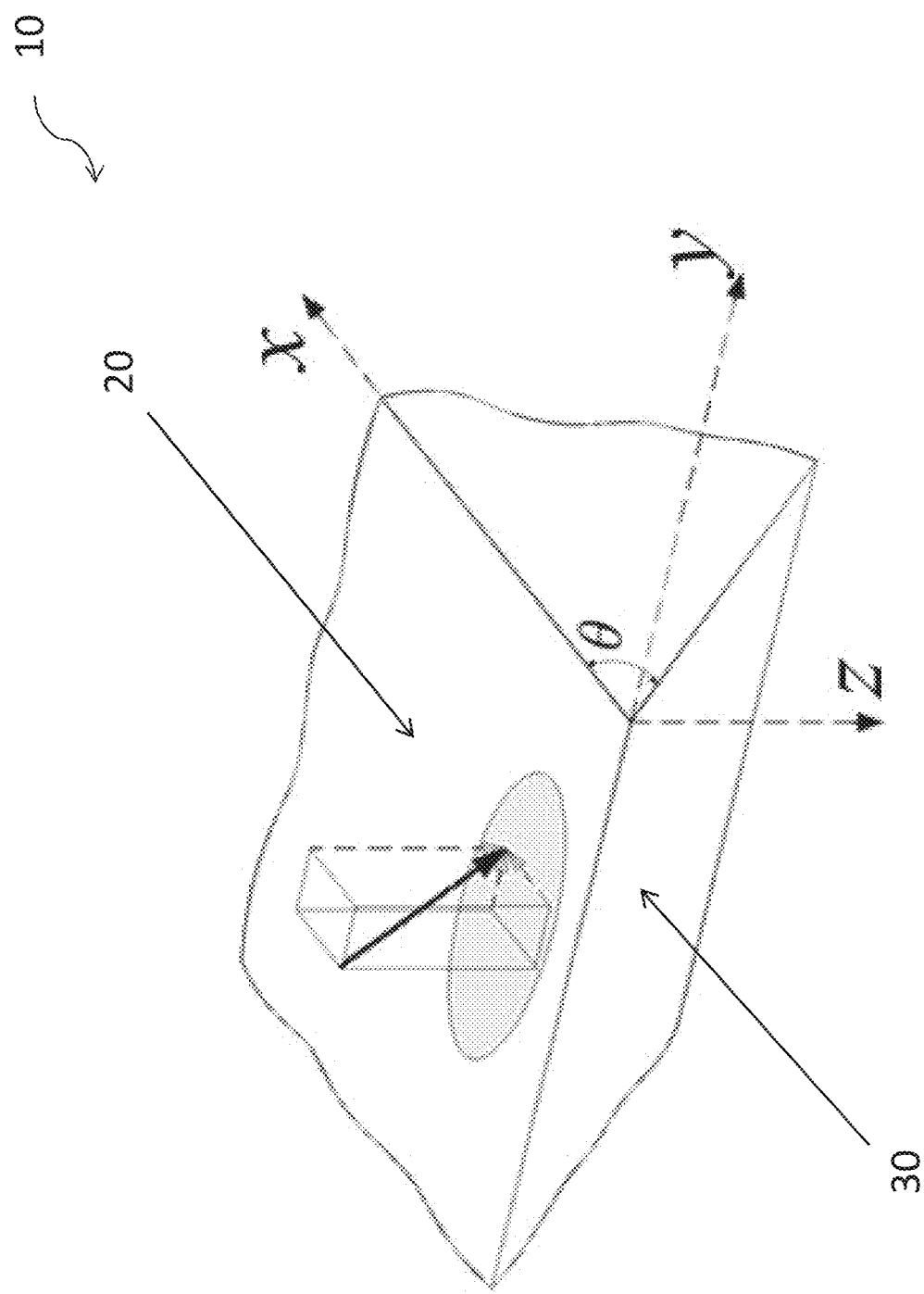
FIG. 1 is an illustration showing a three-dimensional wedge problem.

Referring initially to FIG. 1, there is shown geometry of a wedge 10 having a loaded top surface 20, an edge surface 30, and a wedge angle θ of <180°. The loading on the top surface 20 is subjected to a concentrated or any other type of distributed load, and thus give rise to a 3D wedge problem.

The present invention adopts an analytical approach to tackle such 3D elastic wedge problem through the stress analysis of the wedge 10. Both normal and shear stresses on the two planes of the wedge 10 are considered in the analysis. In this approach, such stress analysis is conducted by using matrix operations, and thus explicit solutions may be obtained. Accordingly, the present invention provides a feasible solution to the stress problem of 3D wedge with given loads, i.e. a fixed stress boundary condition applied.

Figure 2:
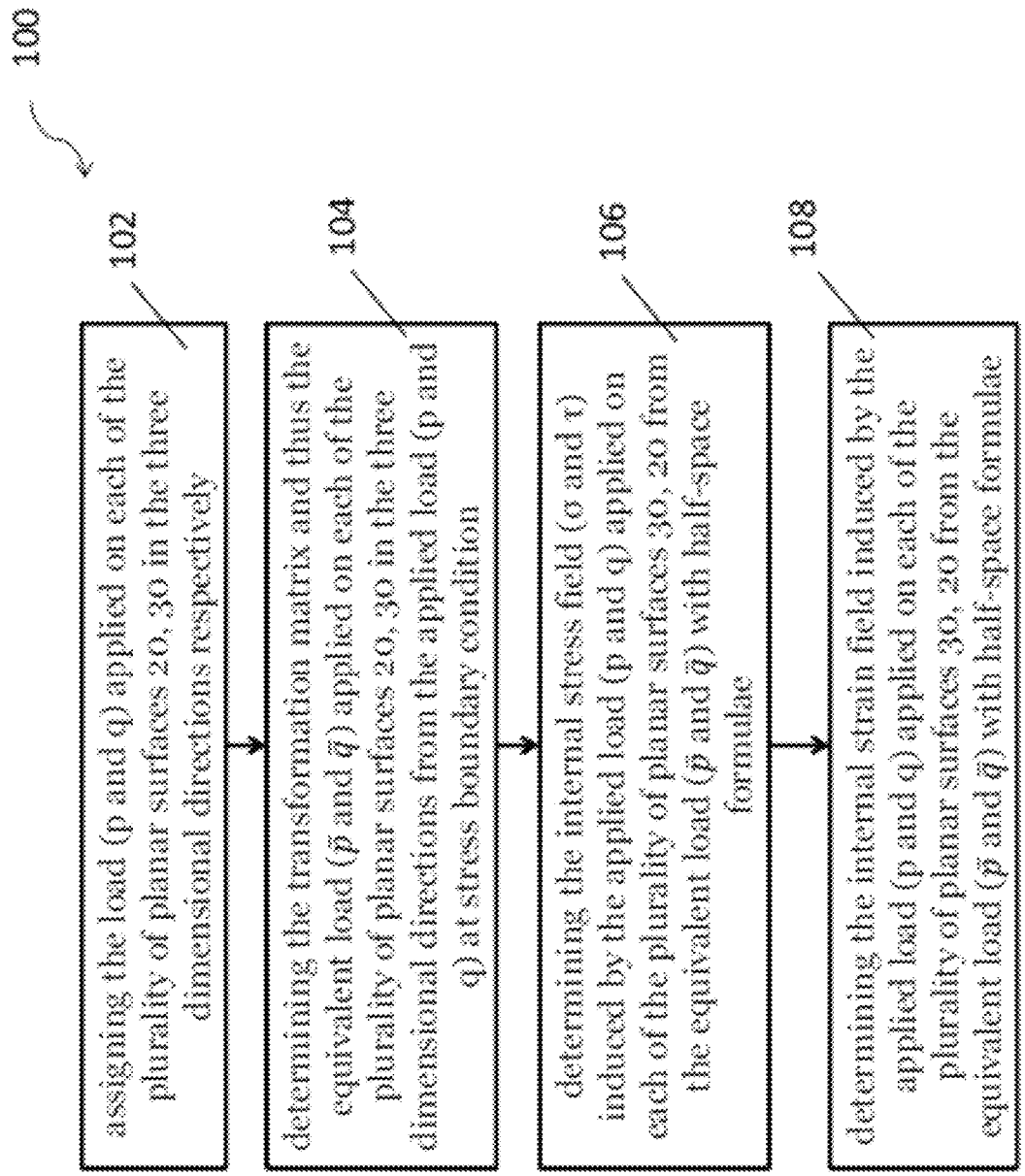
FIG. 2 is a flowchart showing an example embodiment of the method in the present invention.

With reference to FIG. 2, there is provided an example embodiment of an analytical method 100 of determining the solution of an object 10 with a plurality of planar surfaces 20, 30 under applied load, comprising the steps of:

A. assigning given values to the load (p and q) applied on each of the plurality of planar surfaces 20, 30 in the three dimensional directions respectively (step 102);

B. determining the transformation matrix comprising coefficients associated with the physical characteristic of a said object and thus the equivalent load ($\bar{p}$ and $\bar{q}$) applied on each of the plurality of planar surfaces 20, 30 in the three dimensional directions from the applied load (p and q) at stress boundary condition (step 104);

C. determining the internal stress field ($\sigma$ and $\tau$) induced by the applied load (p and q) applied on each of the plurality of planar surfaces 20, 30 based on the equivalent load ($\bar{p}$ and $\bar{q}$) using half-space formulae (step 106);

D. determining the internal strain field induced by the applied load (p and q) applied on each of the plurality of planar surfaces 20, 30 based on the equivalent load ($\bar{p}$ and $\bar{q}$) using half-space formulae (step 108).

The inventors of the present invention have derived that the equivalent load $\bar{p}$ and $\bar{q}$ of half-spaces can be determined from the applied load p and q and the transformation matrix which is associated with the physical characteristic of the object 10, such as the elastic property of the object 10 and the relative orientations between the planar surfaces 20, 30 (step 104).

Accordingly, once the equivalent normal p and shear q load are determined from the method of the present invention, the stress and strain fields induced in the body 10 can be obtained by using the classical formulae derived based on half-space model (steps 106, 108). Finally, the initiation of mechanical failure taking the form of plastic yielding and deformation of the object 10 due to the applied load p and q may be predicted from the induced stress $\sigma$ and $\tau$ in the three dimensional direction (steps 106, 108).

Figure 3B:
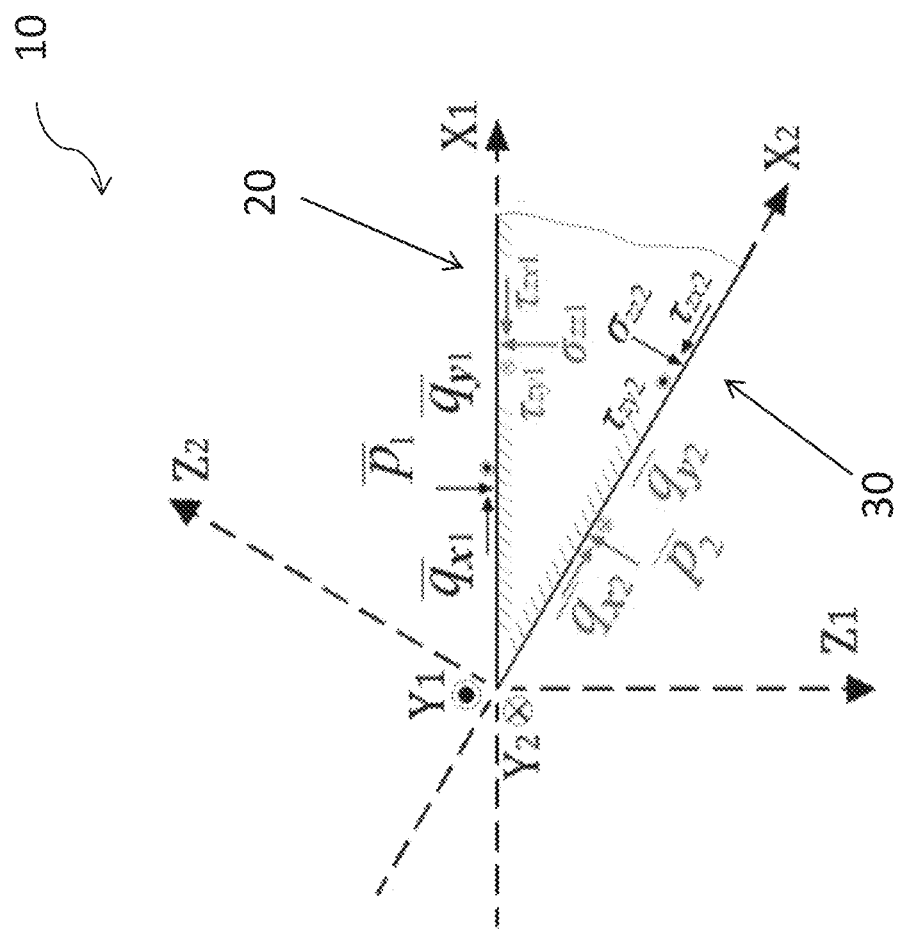
FIG. 3b is an illustration showing the superposition of two half-spaces with equivalent loads ($\bar{p}$, and $\bar{q}$) and corresponding induced stresses on the two planar surfaces of the wedge.
Figure 3A:
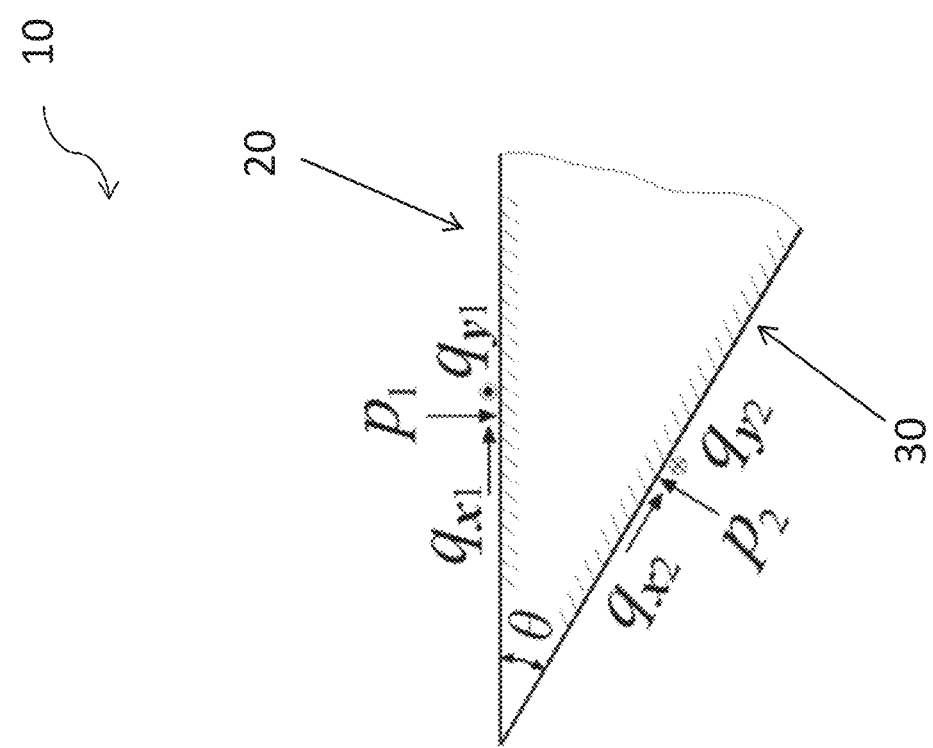
FIG. 3a is an illustration showing a wedge with normal and shear loads (p and q)

Referring to FIG. 3a, the object 10 may be a wedge having two planar surfaces, a top surface 20 and an edge surface 30, each of which is subjected to normal load p on the planar surface and shear loads q along the planar surface respectively.

Referring to FIG. 3b, each of the normal load p and shear load q applied on the planar surfaces correspond to an exclusive equivalent normal $\bar{p}$ and shear $\bar{q}$ loads in half-space on the same planar surface. Such equivalent loads induce stresses $\sigma$, $\tau$ on the other plane surfaces of the wedge 10.

Figure 4B:
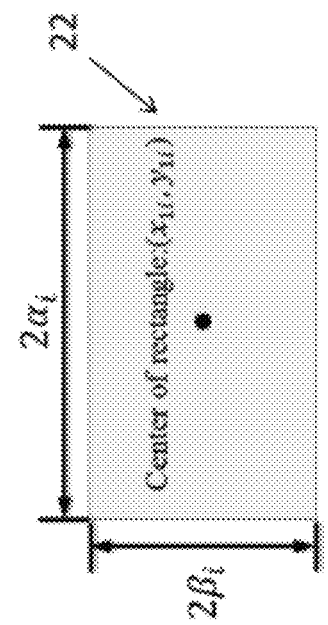
FIG. 4b is an illustration showing an individual rectangle of the grids.
Figure 4A:
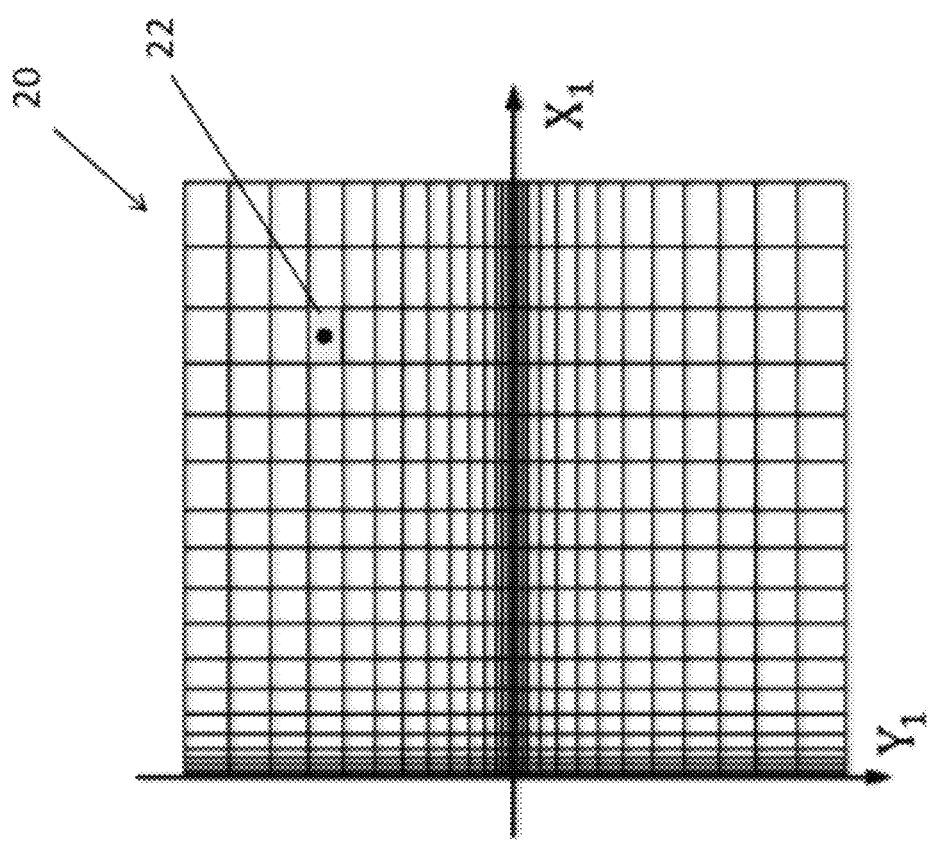
FIG. 4a is an illustration showing the $X_1$-$Y_1$ plane of the wedge with a plurality of grids.

Turning now to the detailed numerical analysis of the present invention, each of the two surfaces 20, 30 of the wedge 10 may undergo discretization to form smaller, uniformly loaded sections. As shown in FIG. 4a, there is provided an effective grid meshing of the top surface 20 of the wedge 10. The surface 20 is divided into k rectangular grids and the ith rectangle 22 of which is shown in FIG. 4b. For instance, the ith rectangle may be dimensioned as $2\alpha_i$ and $2\beta_i$ in the $X_1$ and $Y_1$ directions respectively. The coordinate of its centre is denoted as $(x_{1i}, y_{1i})$ in the coordinate system $X_1$-$Y_1$-$Z_1$. The other surface 30 of the wedge 10 may also be discretized into a set of l rectangles each having a coordinate of $(x_{2j}, y_{2j})$ in the coordinate system $X_2$-$Y_2$-$Z_2$.

In one example embodiment, the loads p, q applied on the two surfaces 20, 30 may be approached by piece-wise distributions. The values of the distributed loads on the two surfaces 20, 30 are represented by the values at the centres of rectangles. For instance, the distributed load of the ith rectangular section for the top surface 20 may be represented by $(p_1)_i = p_1(x_{1i}, y_{1i})$, and $(q_{y1})_i = q_{y1}(x_{1i}, y_{1i})$ and the distributed load of the jth rectangle for the edge surface 30 may be represented by $(p_2)_j = p_2(x_{2j}, y_{2j})$, $(q_{x2})_j = q_{x2}(x_{2j}, y_{2j})$ and $(q_{y2})_j = q_{y2}(X_{2j}, Y_{2j})$.

Preferably, the applied load applied on each of the plurality of surfaces 20 and 30 may be represented in the form of the accumulation of uniform loads applied on each uniformly loaded section. For instance, the normal and shear loads on the top surface 20 and the edge surface 30 may be defined as $P_1$, $Q_{X1}$, $Q_{Y1}$ and $P_2$, $Q_{X2}$, $Q_{Y2}$ in vector format, as expressed respectively in Equations (1) and (2)

$$P_1 = \begin{bmatrix} (p_1)_1 \\ (p_1)_2 \\ \vdots \\ (p_1)_k \end{bmatrix}; Q_{X1} = \begin{bmatrix} (q_{x1})_1 \\ (q_{x1})_2 \\ \vdots \\ (q_{x1})_k \end{bmatrix}; Q_{Y1} = \begin{bmatrix} (q_{y1})_1 \\ (q_{y1})_2 \\ \vdots \\ (q_{y1})_k \end{bmatrix} \quad (1)$$

$$P_2 = \begin{bmatrix} (p_2)_1 \\ (p_2)_2 \\ \vdots \\ (p_2)_l \end{bmatrix}; Q_{X2} = \begin{bmatrix} (q_{x2})_1 \\ (q_{x2})_2 \\ \vdots \\ (q_{x2})_l \end{bmatrix}; Q_{Y2} = \begin{bmatrix} (q_{y2})_1 \\ (q_{y2})_2 \\ \vdots \\ (q_{y2})_l \end{bmatrix} \quad (2)$$

In one example embodiment, the distributed equivalent load of the ith rectangle for the top surface 20 may be represented by $(\bar{p}_1)_i = \bar{p}_1(x_{1i}, y_{1i})$, $(\bar{q}_{x1})_i = \bar{q}_{x1}(x_{1i}, y_{1i})$, $(\bar{q}_{y1})_i = \bar{q}_{y1}(x_{1i}, y_{1i})$ and the distributed equivalent load of the jth rectangle for the edge surface 30 may be represented by ($\bar{p}_2)_j = \bar{p}_2(x_{2j}, y_{2j})$, $(\bar{q}_{x2})_j = \bar{q}_{x2}(x_{2j}, y_{2j})$, $(\bar{q}_{y2})_j = \bar{q}_{y2}(x_{2j}, y_{2j})$.

In a similar manner, the equivalent load applied on each of the plurality of surfaces 20 and 30 may be represented in the form of the accumulation of uniform equivalent loads applied on each uniformly loaded section. For instance, the corresponding equivalent loads, $\bar{P}_1$, $\bar{Q}_{X1}$, and $\bar{Q}_{Y1}$, and $\bar{P}_2$, $\bar{Q}_{X2}$ and $\bar{Q}_{Y2}$ acting on the imaginary half-space formed by the extension of the top surface 20 of plane $X_1$-$Y_1$ and the edge surface 30 of plane $X_2$-$Y_2$ may also be expressed with piece-wise distribution in Equations (3) and (4).

$$\bar{P}_1 = \begin{bmatrix} (\bar{p}_1)_1 \\ (\bar{p}_1)_2 \\ \vdots \\ (\bar{p}_1)_k \end{bmatrix}; \bar{Q}_{X1} = \begin{bmatrix} (\bar{q}_{x1})_1 \\ (\bar{q}_{x1})_2 \\ \vdots \\ (\bar{q}_{x1})_k \end{bmatrix}; \bar{Q}_{Y1} = \begin{bmatrix} (\bar{q}_{y1})_1 \\ (\bar{q}_{y1})_2 \\ \vdots \\ (\bar{q}_{y1})_k \end{bmatrix} \quad (3)$$

$$\bar{P}_2 = \begin{bmatrix} (\bar{p}_2)_1 \\ (\bar{p}_2)_2 \\ \vdots \\ (\bar{p}_2)_l \end{bmatrix}; \bar{Q}_{X2} = \begin{bmatrix} (\bar{q}_{x2})_1 \\ (\bar{q}_{x2})_2 \\ \vdots \\ (\bar{q}_{x2})_l \end{bmatrix}; \bar{Q}_{Y2} = \begin{bmatrix} (\bar{q}_{y2})_1 \\ (\bar{q}_{y2})_2 \\ \vdots \\ (\bar{q}_{y2})_l \end{bmatrix} \quad (4)$$

The inventors have further devised that the corresponding equivalent loads $\bar{P}_1$, $\bar{Q}_{X1}$, $\bar{Q}_{Y1}$ and $\bar{P}_2$, $\bar{Q}_{X2}$, $\bar{Q}_{Y2}$ are related to the original applied loads $P_1$, $Q_{X1}$, $Q_{Y1}$ and $P_2$, $Q_{X2}$, $Q_{Y2}$ onto the planar surface 20, 30 and a transformation matrix associated with the Poisson's ratio of the material, the wedge angle $\theta$ i.e. the orientation between the planar surfaces 20, 30. It may be appreciated by the persons skilled in the art that the equivalent load may be obtained from the applied load and the transformation matrix through mathematical calculations.

In one example embodiment, the equivalent load in vector format of each of the plurality of surfaces 20 and 30 may be represented by the transformation matrix containing two dimensional coefficients associated with the physical characteristic of the object 10 and the applied load. The transformation matrix may be derived from the accumulation of two dimensional coefficients of each uniformly loaded section used in the classical formulae for half-space stress and strain calculations. It would be appreciated by persons skilled in the art that the transformation matrix is dependent on the predetermined size and location of the uniformly loaded sections meshed from the plurality of surfaces 20 and 30.

In one example embodiment, the stress induced by equivalent loads on each of the plurality of planar surfaces 20 and 30 may also be represented in the form of the accumulation of stresses induced on the centre of each uniformly loaded section. For instance, the stresses at rectangle j on the plane $X_2$-$Y_2$ in the imaginary half-space induced by equivalent loads $\bar{p}_1$ and $\bar{q}_1$ on the plane $X_1$-$Y_1$ are denoted by their values at the centres of the rectangles, namely, $(\sigma_{zz2})_j = \sigma_{zz2}(x_{2j}, y_{2j})$, $(\tau_{zx2})_j = \sigma_{zx2}(x_{2j}, y_{2j})$, and $(\tau_{zy2})_j = \tau_{zy2}(x_{2j}, y_{2j})$. These induced stresses of the plane $X_2$-$Y_2$ form three vectors, $S_Z$, $S_X$, and $S_Y$ (Equation (5)).

$$S_Z = \begin{bmatrix} (\sigma_{zz2})_1 \\ (\sigma_{zz2})_2 \\ \vdots \\ (\sigma_{zz2})_l \end{bmatrix}; S_X = \begin{bmatrix} (\tau_{zx2})_1 \\ (\tau_{zx2})_2 \\ \vdots \\ (\tau_{zx2})_l \end{bmatrix}; S_Y = \begin{bmatrix} (\tau_{zy2})_1 \\ (\tau_{zy2})_2 \\ \vdots \\ (\tau_{zy2})_l \end{bmatrix} \quad (5)$$

Similarly, the stresses at rectangle i on the plane $X_1$-$Y_1$ in the imaginary half-space induced by these equivalent loads on the plane $X_2$-$Y_2$ are denoted by their values at the centres of the rectangles, namely, $(\sigma_{zz1})_i = \sigma_{zz1}(x_{1i}, y_{1i})$, $(\sigma_{zx1})_i = \tau_{zx1}(x_{1i}, y_{1i})$, $(\tau_{zy1})_i = \tau_{zy1}(x_{1i}, y_{1i})$. These induced stresses of the plane $X_1$-$Y_1$ form three vectors, namely, $T_Z$, $T_X$, and $T_Y$ (Equation (6)).

$$T_Z = \begin{bmatrix} (\sigma_{zz1})_1 \\ (\sigma_{zz1})_2 \\ \vdots \\ (\sigma_{zz1})_k \end{bmatrix}; T_X = \begin{bmatrix} (\tau_{zx1})_1 \\ (\tau_{zx1})_2 \\ \vdots \\ (\tau_{zx1})_k \end{bmatrix}; T_Y = \begin{bmatrix} (\tau_{zy1})_1 \\ (\tau_{zy1})_2 \\ \vdots \\ (\tau_{zy1})_k \end{bmatrix} \quad (6)$$

The stresses $\sigma_{zz2}$, $\tau_{zx2}$, and $\tau_{zy2}$ may be represented in the following expressions (Equations (7) to (9)) in terms of coefficients from $m_{zzij}$ to $m_{yyij}$ where the first subscript of m signifies the applied equivalent load on the ith rectangle on the plane $X_1$-$Y_1$. The second subscript represents the induced stress at the jth rectangle on the plane $X_2$-$Y_2$:

$$\sigma_{zz2}(x_{2j},y_{2j}) = m_{zzij}\bar{p}_1(x_{1i},y_{1i}) + m_{zxij}\bar{q}_{x1}(x_{1i},y_{1i}) + m_{zyij}\bar{q}_{y1}(x_{1i},y_{1i}) \quad (7)$$

$$\tau_{zx2}(x_{2j},y_{2j}) = m_{xzij}\bar{p}_1(x_{1i},y_{1i}) + m_{xxij}\bar{q}_{x1}(x_{1i},y_{1i}) + m_{xyij}\bar{q}_{y1}(x_{1i},y_{1i}) \quad (8)$$

$$\tau_{zy2}(x_{2j},y_{2j}) = m_{yzij}\bar{p}_1(x_{1i},y_{1i}) + m_{yxij}\bar{q}_{x1}(x_{1i},y_{1i}) + m_{yyij}\bar{q}_{y1}(x_{1i},y_{1i}) \quad (9)$$

Similarly, the stresses $\sigma_{zz1}$, $\tau_{zx1}$, $\tau_{zy1}$ on the plane $X_1$-$Y_1$ induced by equivalent loads $(\bar{p}_2)_j$, $(\bar{q}_{x2})_j$, $(\bar{q}_{y2})_j$ on the plane $X_2$-$Y_2$ are represented by the following expressions (Equations (10) to (12)):

$$\sigma_{zz1}(x_{1i},y_{1i}) = n_{zzji}\bar{p}_2(x_{2j},y_{2j}) + n_{zxji}\bar{q}_{x2}(x_{2j},y_{2j}) + n_{zyji}\bar{q}_{y2}(x_{2j},y_{2j}) \quad (10)$$

$$\tau_{zx1}(x_{1i},y_{1i}) = n_{xzji}\bar{p}_2(x_{2j},y_{2j}) + n_{xxji}\bar{q}_{x2}(x_{2j},y_{2j}) + n_{xyji}\bar{q}_{y2}(x_{2j},y_{2j}) \quad (11)$$

$$\tau_{zy1}(x_{1i},y_{1i}) = n_{yzji}\bar{p}_2(x_{2j},y_{2j}) + n_{yxji}\bar{q}_{x2}(x_{2j},y_{2j}) + n_{yyji}\bar{q}_{y2}(x_{2j},y_{2j}) \quad (12)$$

The relationship between these equivalent loads and stresses of half-space model may be determined. Accordingly, the three induced stress vectors $S_Z$, $S_X$, $S_Y$ on the plane $X_2$-$Y_2$ due to the equivalent normal and shear load vectors $\bar{P}_1$, $\bar{Q}_{X1}$, $\bar{Q}_{Y1}$ on the plane $X_1$-$Y_1$ can be determined based on the half-space model by the following expressions:

$$S_Z = M_{ZZ} \cdot \bar{P}_1 + M_{ZX} \cdot \bar{Q}_{X1} + M_{ZY} \cdot \bar{Q}_{Y1} \quad (13)$$

$$S_X = M_{XZ} \cdot \bar{P}_1 + M_{XX} \cdot \bar{Q}_{X1} + M_{XY} \cdot \bar{Q}_{Y1} \quad (14)$$

$$S_Y = M_{YZ} \cdot \bar{P}_1 + M_{YX} \cdot \bar{Q}_{X1} + M_{YY} \cdot \bar{Q}_{Y1} \quad (15)$$

Similarly, the equivalent normal and shear load vectors, $\bar{P}_2$, $\bar{Q}_{X2}$, $\bar{Q}_{Y2}$ on the surface $X_2$-$Y_2$ of half-space induces stress vectors, $T_Z$, $T_X$, and $T_Y$, on the plane $X_1$-$Y_1$ can be determined based on the half-space model by:

$$T_Z = N_{ZZ} \cdot \bar{P}_2 + N_{ZX} \cdot \bar{Q}_{X2} + N_{ZY} \cdot \bar{Q}_{Y2} \quad (16)$$

$$T_X = N_{XZ} \cdot \bar{P}_2 + N_{XX} \cdot \bar{Q}_{X2} + N_{XY} \cdot \bar{Q}_{Y2} \quad (17)$$

$$T_Y = N_{YZ} \cdot \bar{P}_2 + N_{YX} \cdot \bar{Q}_{X2} + N_{YY} \cdot \bar{Q}_{Y2} \quad (18)$$

The two-dimensional array of the coefficients forms the following nine reflecting matrices $M_{ZZ}$, $M_{ZX}$, $M_{ZY}$, $M_{XZ}$, $M_{XX}$, $M_{XY}$, $M_{YZ}$, $M_{YX}$ and $M_Y$ (in Equations (19) to (27)) and $N_{ZZ}$, $N_{ZX}$, $N_{ZY}$, $N_{XZ}$, $N_{XX}$, $N_{XY}$, $N_{YZ}$, $N_{YX}$ and $N_{YY}$ (in Equations (28) to (36)).

$$M_{ZZ} = \begin{bmatrix} m_{zz11} & m_{zz21} & \cdots & m_{zzk1} \\ m_{zz12} & m_{zz22} & \cdots & m_{zzk2} \\ \vdots & \vdots & \ddots & \vdots \\ m_{zz1l} & m_{zz2l} & \cdots & m_{zzkl} \end{bmatrix} \quad (19)$$

$$M_{ZX} = \begin{bmatrix} m_{zx11} & m_{zx21} & \cdots & m_{zxk1} \\ m_{zx12} & m_{zx22} & \cdots & m_{zxk2} \\ \vdots & \vdots & \ddots & \vdots \\ m_{zx1l} & m_{zx2l} & \cdots & m_{zxkl} \end{bmatrix} \quad (20)$$

$$\vdots$$

$$M_{YY} = \begin{bmatrix} m_{yy11} & m_{yy21} & \cdots & m_{yyk1} \\ m_{yy12} & m_{yy22} & \cdots & m_{yyk2} \\ \vdots & \vdots & \ddots & \vdots \\ m_{yy1l} & m_{yy2l} & \cdots & m_{yykl} \end{bmatrix} \quad (27)$$

$$N_{ZZ} = \begin{bmatrix} n_{zz11} & n_{zz21} & \cdots & n_{zzl1} \\ n_{zz12} & n_{zz22} & \cdots & n_{zzl2} \\ \vdots & \vdots & \ddots & \vdots \\ n_{zz1k} & n_{zz2k} & \cdots & n_{zzlk} \end{bmatrix} \quad (28)$$

$$N_{ZX} = \begin{bmatrix} n_{zx11} & n_{zx21} & \cdots & n_{zxl1} \\ n_{zx12} & n_{zx22} & \cdots & n_{zxl2} \\ \vdots & \vdots & \ddots & \vdots \\ n_{zx1k} & n_{zx2k} & \cdots & n_{zxlk} \end{bmatrix} \quad (29)$$

$$\vdots$$

$$N_{YY} = \begin{bmatrix} n_{yy11} & n_{yy21} & \cdots & n_{yyl1} \\ n_{yy12} & n_{yy22} & \cdots & n_{yyl2} \\ \vdots & \vdots & \ddots & \vdots \\ n_{yy1k} & n_{yy2k} & \cdots & n_{yylk} \end{bmatrix} \quad (36)$$

By knowing the physical properties of the wedge 10 and the normal and shear loads $P_1$, $Q_{X1}$, $Q_{Y1}$ and $P_2$, $Q_{X2}$, $Q_{Y2}$ applied on the top and edge surfaces 20, 30, the equivalent loads $\overline{P}_1$, $\overline{Q}_{X1}$, and $\overline{Q}_{Y1}$, and $\overline{P}_2$, $\overline{Q}_{X2}$ and $\overline{Q}_{Y2}$ on the two wedge surfaces 20 and 30 may be determined readily from the transformation matrix by the following expression:

$$\begin{bmatrix} \overline{P}_1 \\ \overline{Q}_{X1} \\ \overline{Q}_{Y1} \\ \overline{P}_2 \\ \overline{Q}_{X2} \\ \overline{Q}_{Y2} \end{bmatrix} = \quad (37)$$

$$\begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1} \begin{bmatrix} P_1 \\ Q_{X1} \\ Q_{Y1} \\ P_2 \\ Q_{X2} \\ Q_{Y2} \end{bmatrix}$$

The transformation matrix is expressed with:

$$\begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1} \quad (38)$$

By determining the equivalent load $\overline{P}_1$, $\overline{Q}_{X1}$, and $\overline{Q}_{Y1}$, and $\overline{P}_2$, $\overline{Q}_{X2}$ and $\overline{Q}_{Y2}$ on the two edge surfaces 20 and 30 with the transformation matrix above (Equation (38)), the induced stress vectors may be obtained from the known equivalent loads using the classical half-space formulae accordingly.

Figure 5:
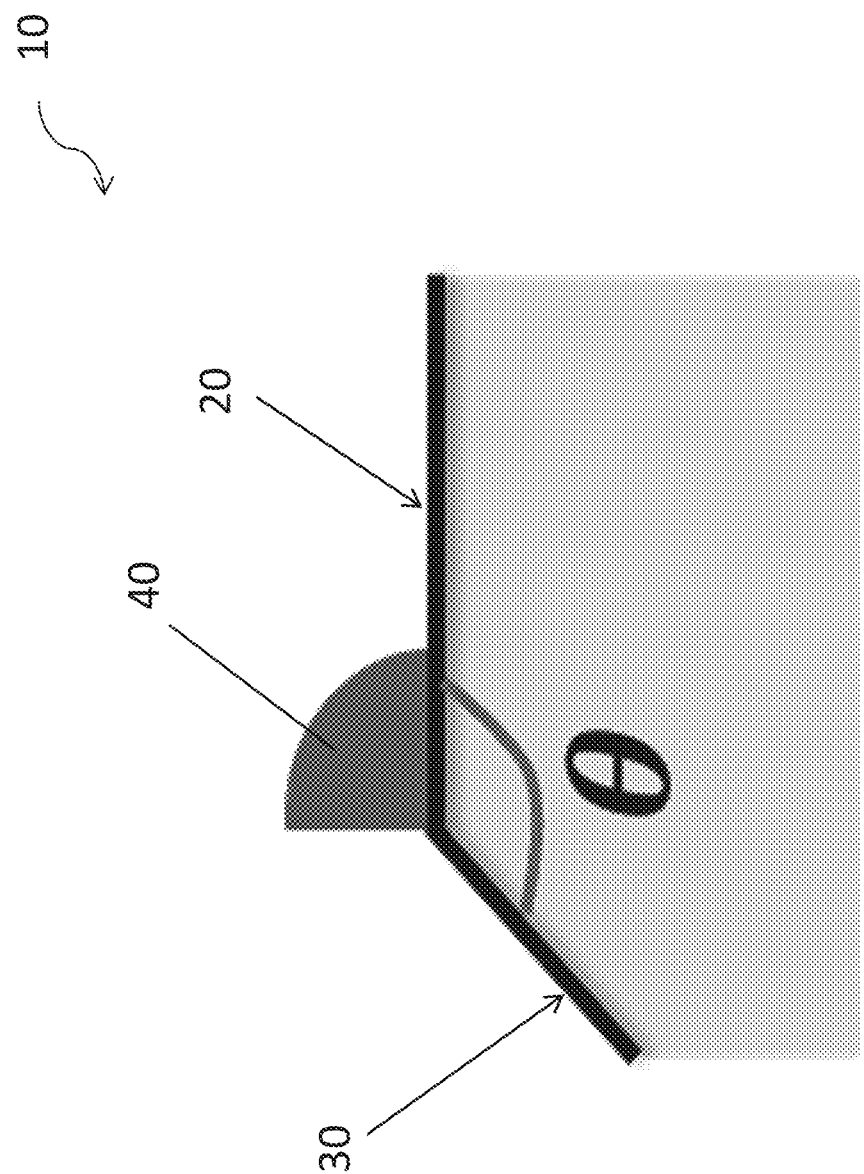
FIG. 5 is an illustration showing a half-semispherical normal load distribution applied on the top surface of the wedge structure.

In one example embodiment, the analytical method 100 in the present invention is adopted for determining the stress and strain of a wedge 10 with a Poisson's ratio of 0.3, a load applied on the top surface 20 of the wedge 10, and a wedge angle θ between the top surface 20 and the edge surface 30 of the wedge 10, as shown in FIG. 5. The top surface 20 is divided into 8500 rectangular grids with 85 units in the $Y_1$-direction and 100 units in the $X_1$-direction.

Figure 6:
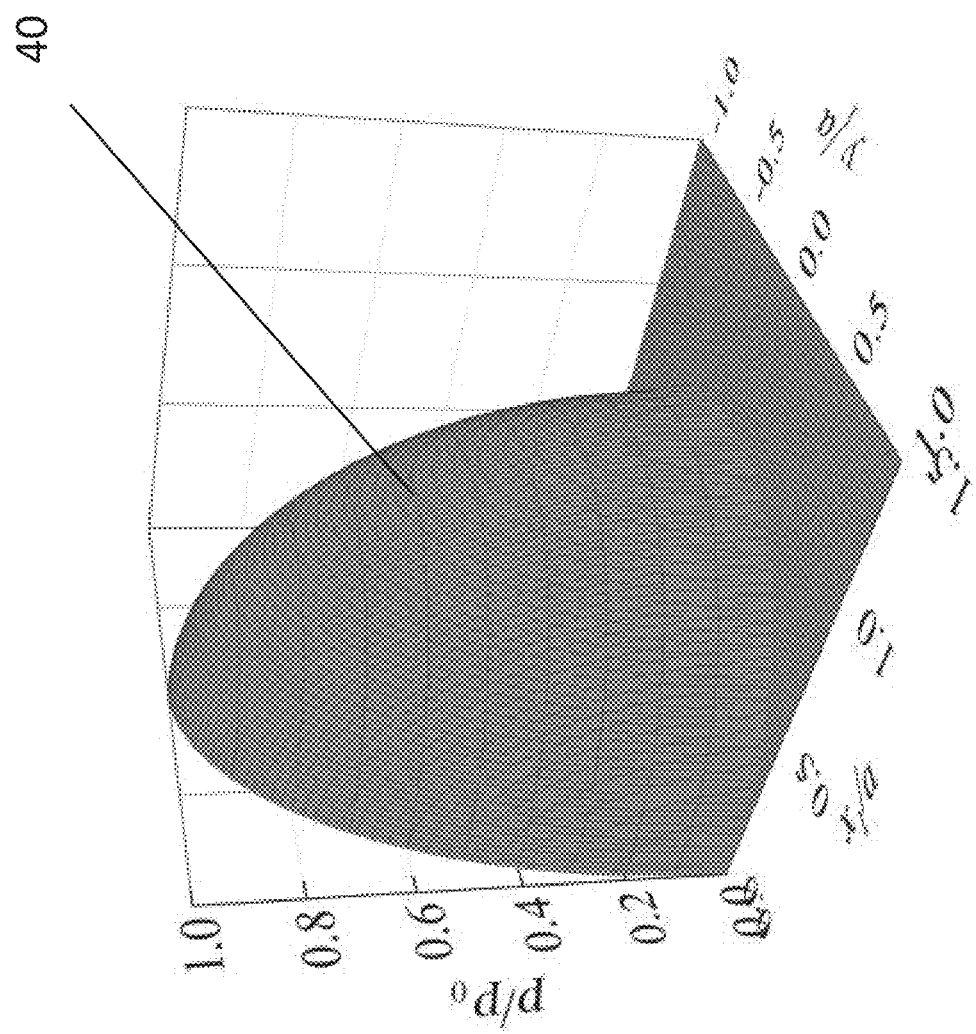
FIG. 6 is an illustration showing the applied load on the top surface of the wedge structure in three dimensional directions.

For instance, the load applied on the top surface 20 may be a half-semispherical normal load distribution 40, as schematically shown in FIGS. 5 and 6 and represented in the following Equation (39). The load is applied to the top surface 20 ($Z1=0$) of the elastic wedge 10 with the maximum, $p_0$, at the origin (0, 0, 0).

$$p(x_1, y_1) = p_0 \frac{\sqrt{a^2 - x_1^2 - y_1^2}}{a}, \quad \sqrt{x_1^2 + y_1^2} \leq a \quad (39)$$

$$p(x_1, y_1) = 0, \quad \sqrt{x_1^2 + y_1^2} > a$$

where a is the radius of the half-semispherical load distribution.

Figure 7A:
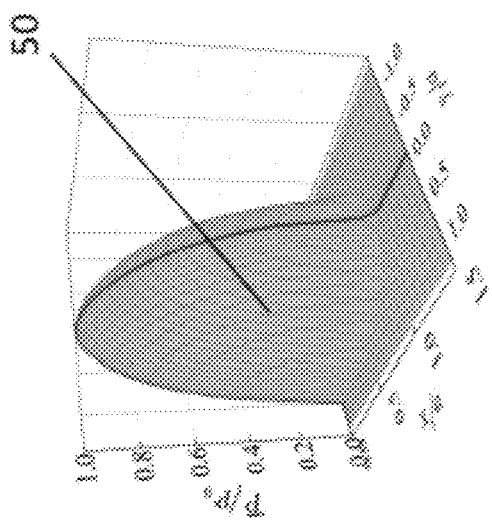
FIG. 7a is an illustration showing the calculated equivalent normal load on $X_1$-$Y_1$ plane of a 170° wedge.
Figure 7B:
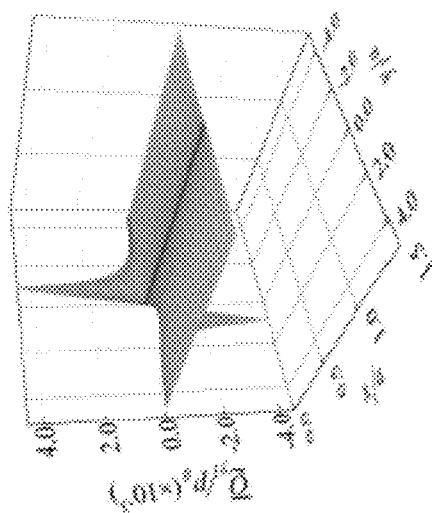
FIG. 7b is an illustration showing the calculated equivalent shear load in $X_1$ direction on $X_1$-$Y_1$ plane of a 170° wedge.
Figure 7C:
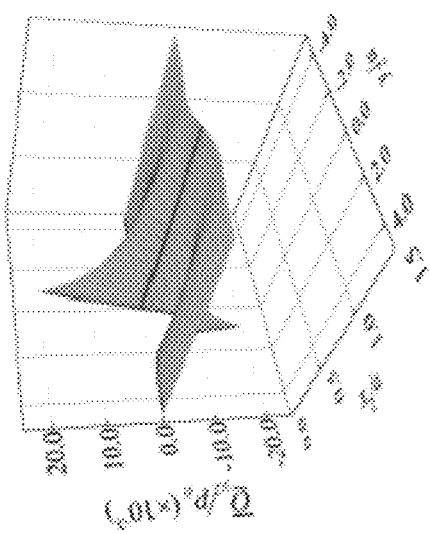
FIG. 7c is an illustration showing the calculated equivalent shear load in $Y_1$ direction on $X_1$-$Y_1$ plane of a 170° wedge.
Figure 7D:
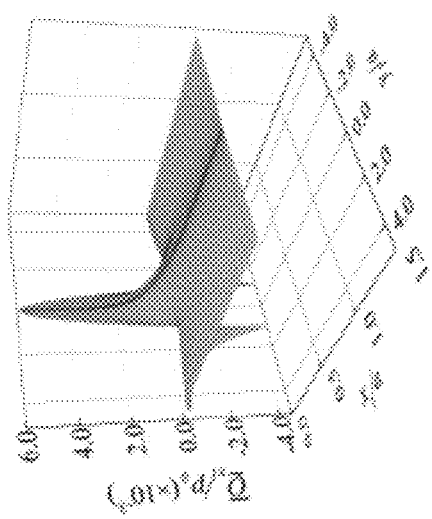
FIG. 7d is an illustration showing the calculated equivalent normal load on $X_2$-$Y_2$ plane of a 170° wedge.
Figure 7E:
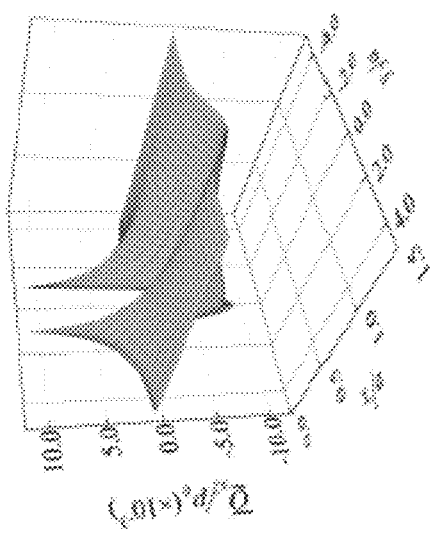
FIG. 7e is an illustration showing the calculated equivalent shear load in $X_2$ direction on $X_2$-$Y_2$ plane of a 170° wedge.
Figure 7F:
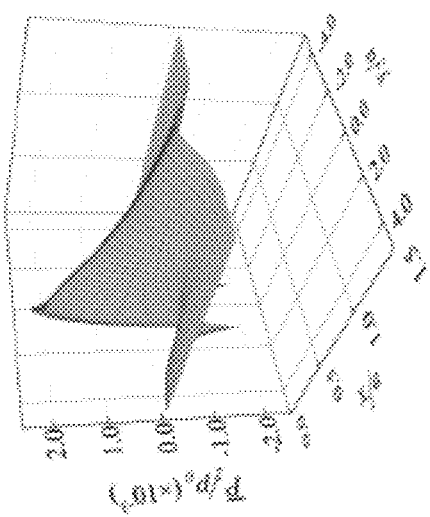
FIG. 7f is an illustration showing the calculated equivalent shear load in $Y_2$ direction on $X_2$-$Y_2$ plane of a 170° wedge.

In one specific embodiment, the two planar surfaces 20 and 30 forms a wedge angle θ of 170°. The six equivalent loads on the top planar surface 20 (as shown in FIGS. 7a to 7c) and edge planar surface 30 (as shown in FIGS. 7d to 7f) are determined from the original load and the transformation matrix (step 104). As shown in FIG. 7a, the equivalent load 50 which is in the direction normal to the top surface 20 of the wedge 10 deviates very little from the original applied load 40 as shown in FIG. 6. The other equivalent loads as shown in FIGS. 7b to 7f are of much smaller magnitude. The resultant stress is thus dominated by the equivalent load 50.

Figure 8A:
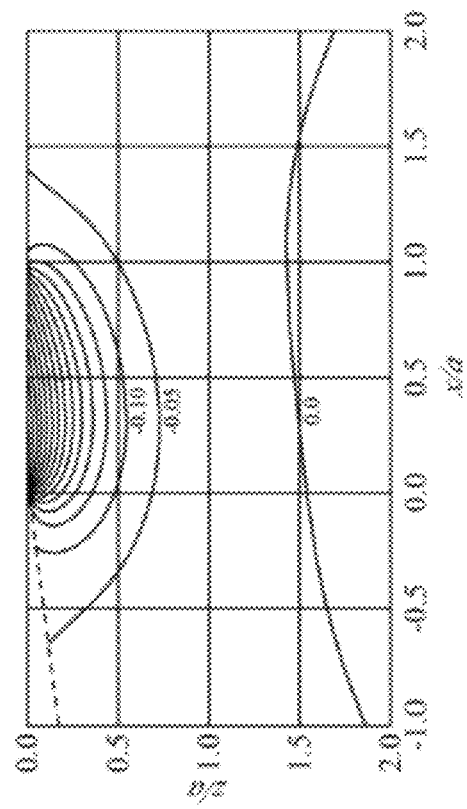
FIG. 8a is an illustration showing the normal stress distribution $\sigma_{xx}$ in the Y=0 plane of a 170° wedge.
Figure 8B:
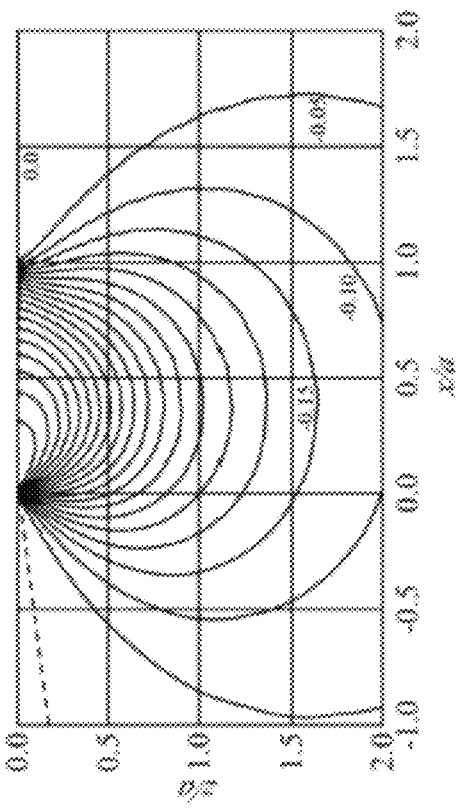
FIG. 8b is an illustration showing the normal stress distribution $\sigma_{yy}$ in the Y=0 plane of a 170° wedge.
Figure 8C:
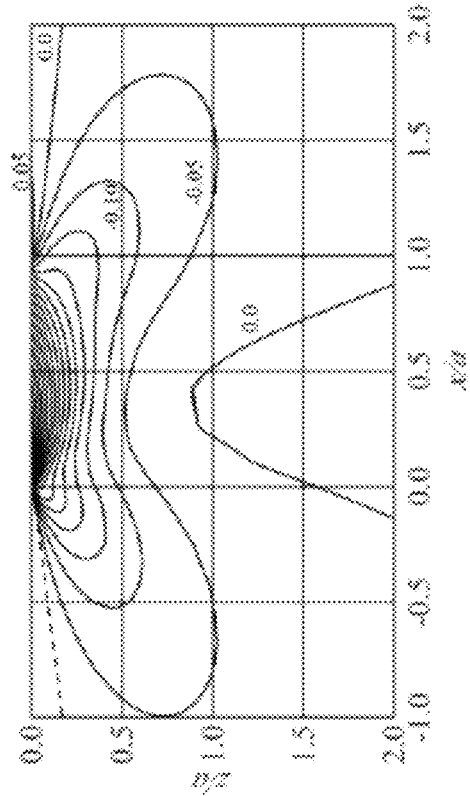
FIG. 8c is an illustration showing the normal stress distribution $\sigma_{zz}$ in the Y=0 plane of a 170° wedge.
Figure 8D:
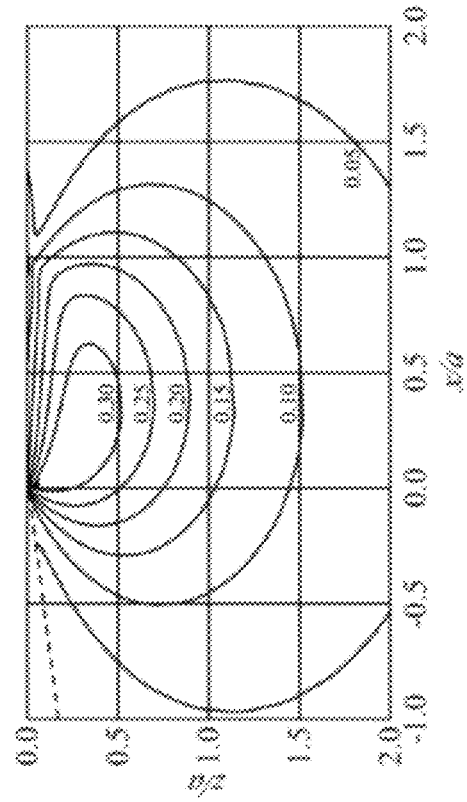
FIG. 8d is an illustration showing the von Mises stress in the Y=0 plane of a 170° wedge.

The internal stress field of the wedge 10 is determined from the summation of stresses calculated with the individual equivalent load (step 106), and the normal and shear stresses on y=0 plane are presented in FIGS. 8a to 8c. Finally, the mechanical failure of the wedge 10 is predicted in FIG. 8d (step 108).

Figure 9A:
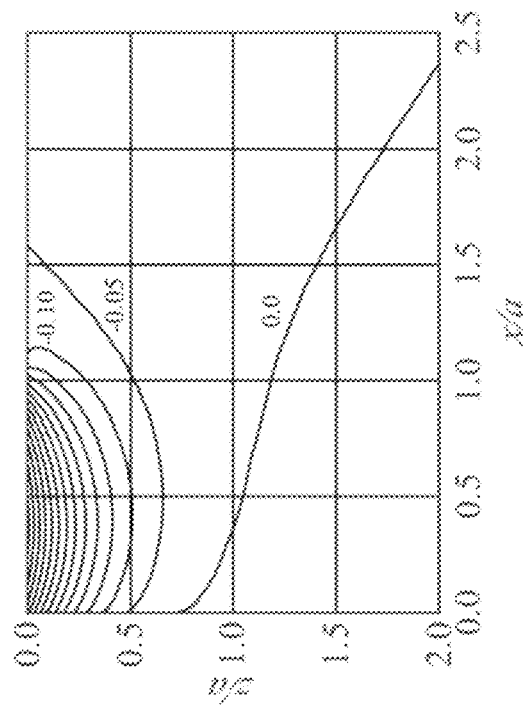
FIG. 9a is an illustration showing the normal stress distribution $\sigma_{xx}$ in the Y=0 plane of a 90° wedge.
Figure 9B:
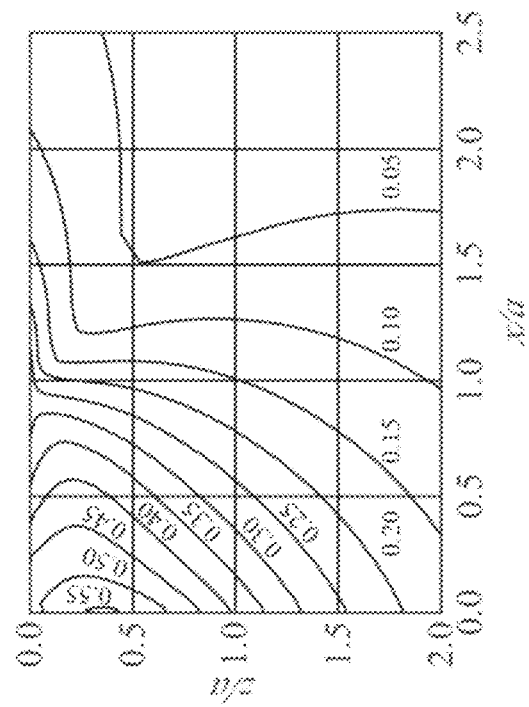
FIG. 9b is an illustration showing the normal stress distribution $\sigma_{yy}$ in the Y=0 plane of a 90° wedge.
Figure 9C:
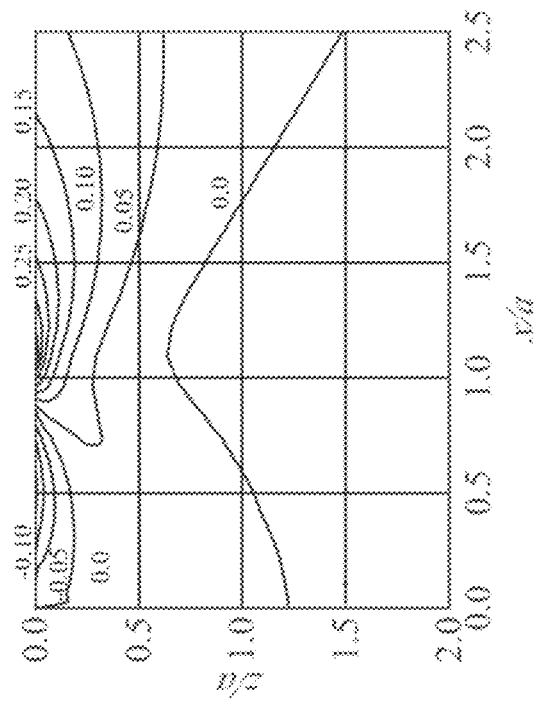
FIG. 9c is an illustration showing the normal stress distribution $\sigma_{zz}$ in the Y=0 plane of a 90° wedge.
Figure 9D:
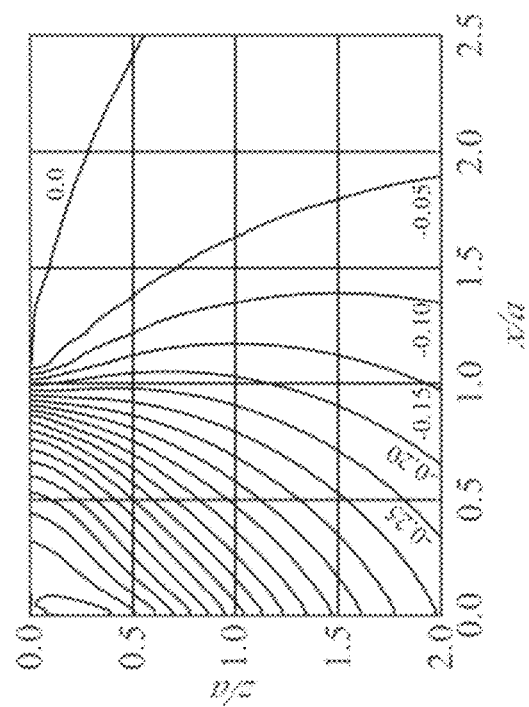
FIG. 9d is an illustration showing the von Mises stress in the Y=0 plane of a 90° wedge.

In another specific embodiment, the two planar surfaces 20 and 30 forms a wedge angle θ of 90°. The six equivalent loads on the two planar surfaces 20 and 30 are determined from the original load and the transformation matrix (step 104). The normal and shear stresses are presented in FIGS. 9a to 9c (step 106), and thus the von Mises stress is determined, as shown in FIG. 9d. Similarly, the strain field can be calculated (step 108). Thus, mechanical failure of the wedge 10 is predicted.

Figure 10A:
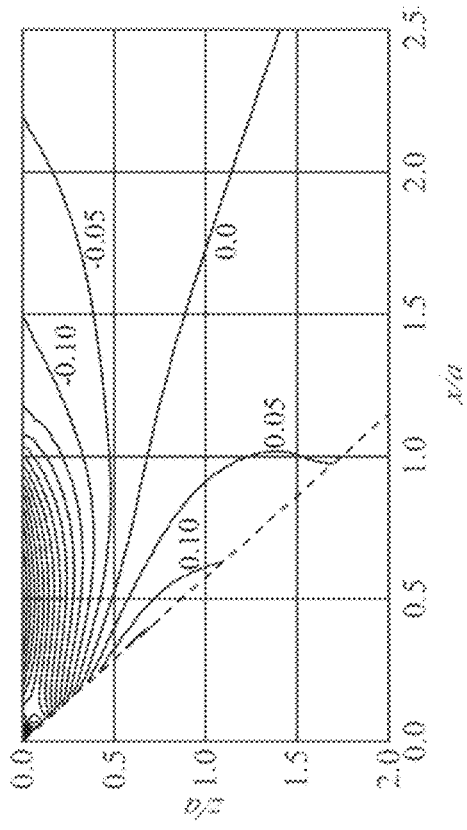
FIG. 10a is an illustration showing the normal stress distribution $\sigma_{xx}$ in the Y=0 plane of a 60° wedge.
Figure 10B:
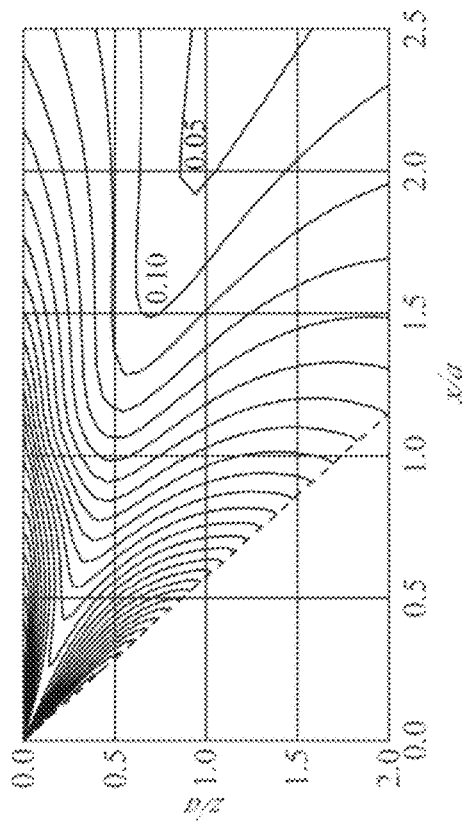
FIG. 10b is an illustration showing the normal stress distribution $\sigma_{yy}$ in the Y=0 plane of a 60° wedge.
Figure 10C:
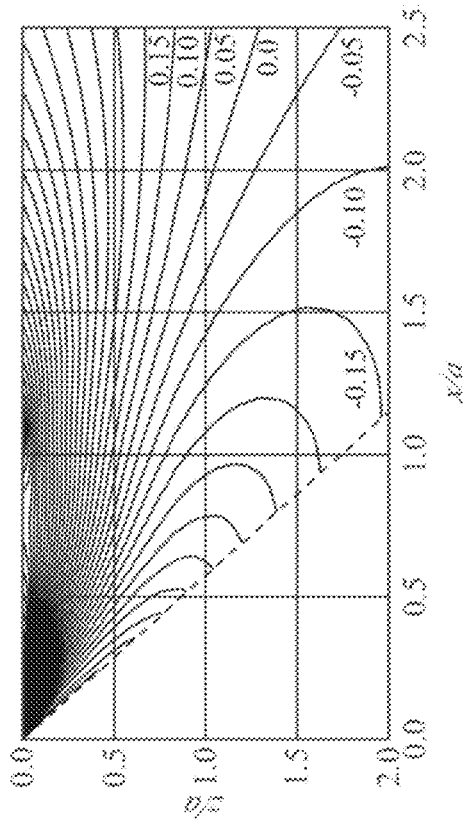
FIG. 10c is an illustration showing the normal stress distribution $\sigma_{zz}$ in the Y=0 plane of a 60° wedge.
Figure 10D:
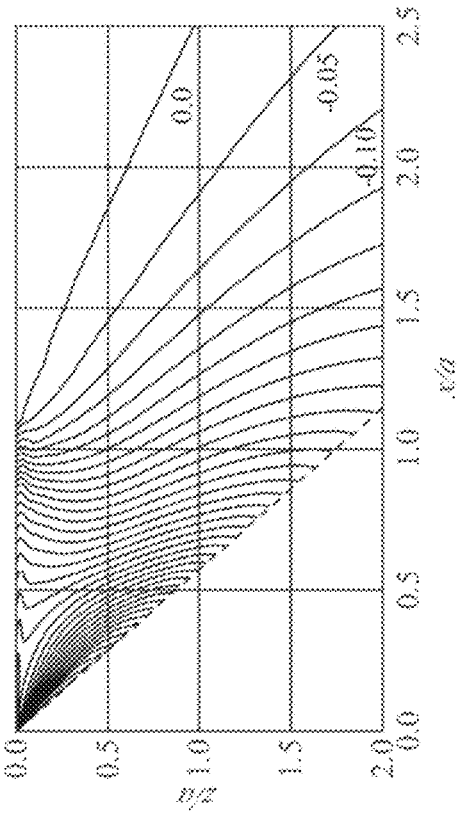
FIG. 10d is an illustration showing the von Mises stress in the Y=0 plane of a 60° wedge.
Figure 11A:
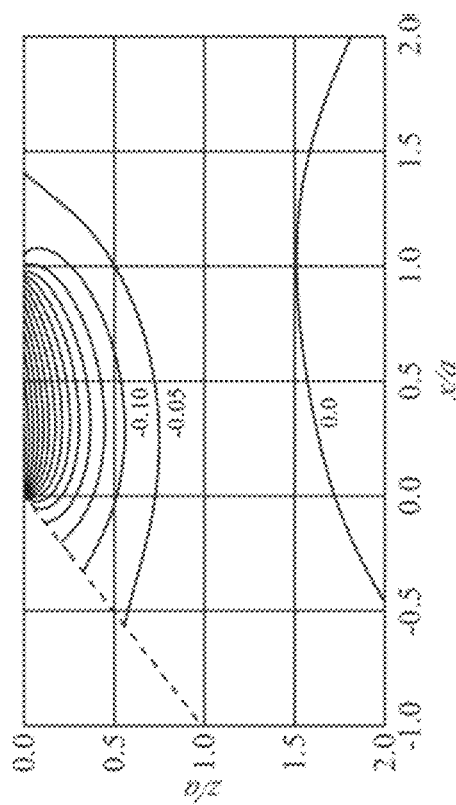
FIG. 11a is an illustration showing the normal stress distribution $\sigma_{xx}$ in the Y=0 plane of a 135° wedge.
Figure 11B:
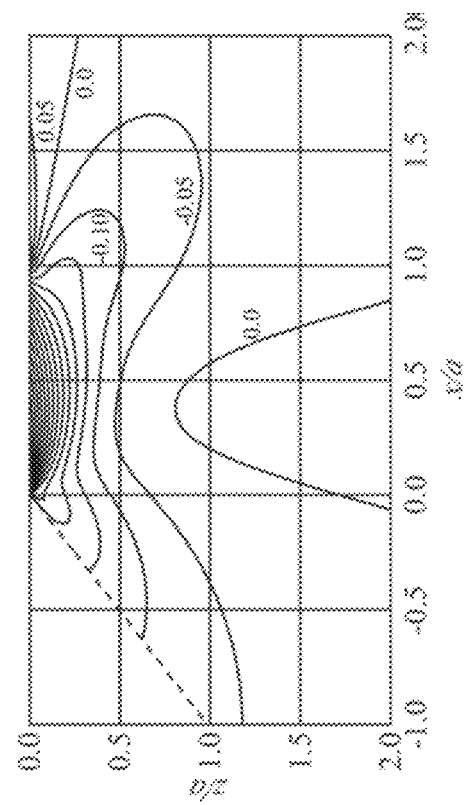
FIG. 11b is an illustration showing the normal stress distribution $\sigma_{yy}$ in the Y=0 plane of a 135° wedge.
Figure 11C:
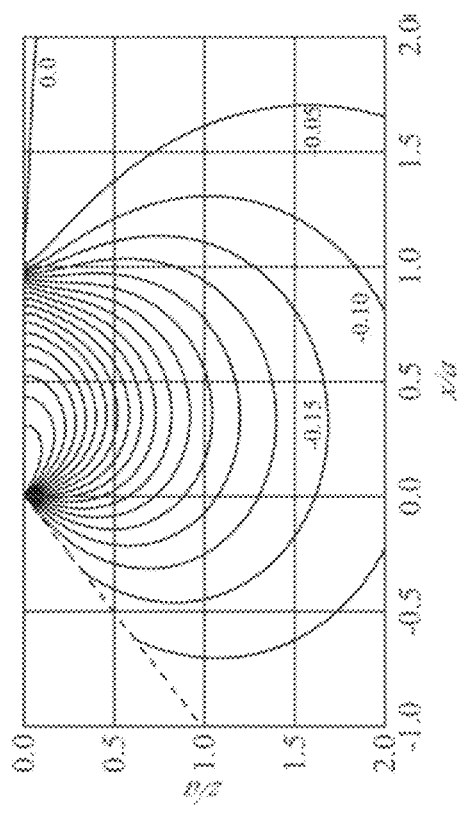
FIG. 11c is an illustration showing the normal stress distribution $\sigma_{zz}$ in the Y=0 plane of a 135° wedge.
Figure 12A:
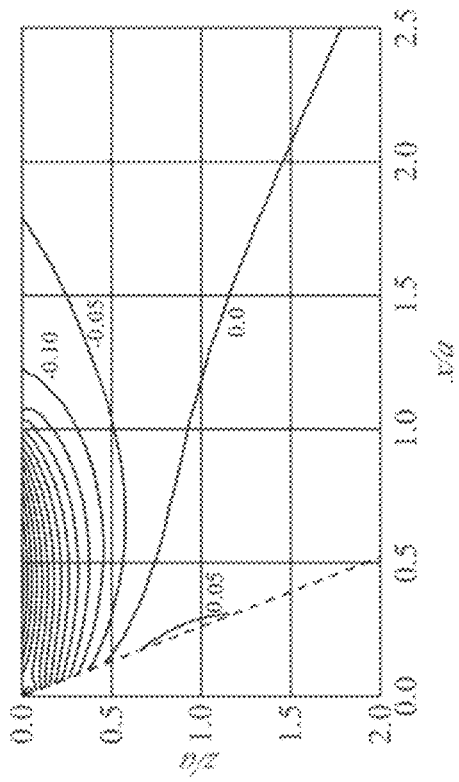
FIG. 12a is an illustration showing the normal stress distribution $\sigma_{xx}$ in the Y=0 plane of a 75° wedge.
Figure 12B:
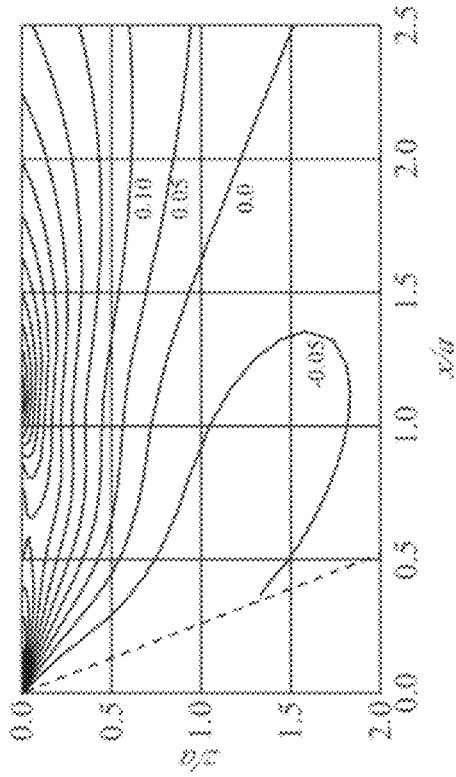
FIG. 12b is an illustration showing the normal stress distribution $\sigma_{yy}$ in the Y=0 plane of a 75° wedge.
Figure 12C:
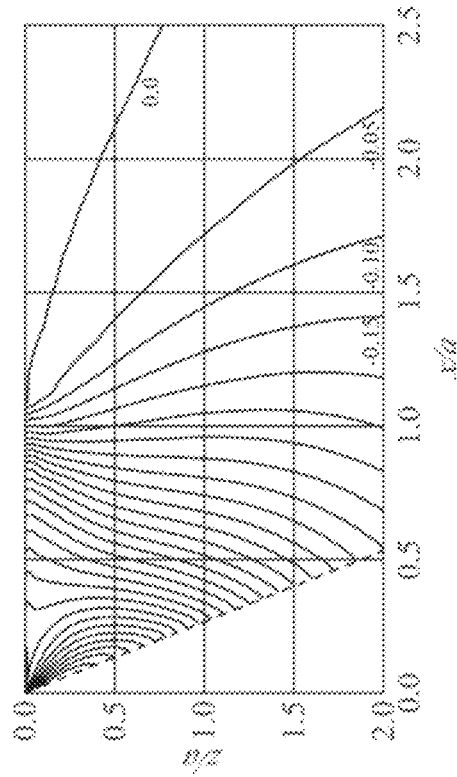
FIG. 12c is an illustration showing the normal stress distribution $\sigma_{zz}$ in the Y=0 plane of a 75° wedge.

In yet another specific embodiment, the two planar surfaces 20 and 30 forms a wedge angle θ of 60°. The six equivalent loads on the two planar surfaces 20 and 30 are determined from the original load and the transformation matrix (step 104). The normal and shear stresses on y=0 plane are presented in FIGS. 10a to 10c (step 106), and thus the von Mises stress is determined, as shown in FIG. 10d. Similarly, the strain field can be calculated (step 108). Thus, mechanical failure of the wedge 10 is predicted.

In one further example embodiment, the stress behaviour of the object 10 with a wedge angle θ of 135° and 70° are also determined by using the present invention and each presented in FIGS. 11a to 11c and FIGS. 12a to 12c respectively.

As shown in FIGS. 8a to 12c, it shows the difference in the normal stresses in the y=0 plane with varying wedge angles θ. The maximum $p_o$ of the half-semispherical distributed-load, as expressed in Equation (35), is at the origin (0, 0, 0).

Referring to the example of $\sigma_{xx}$ in FIGS. 8a, 9a, 10a, 11a and 12a, the maximum tensile stress located on the top surface 20 next to the right boundary of the applied load increases with decreasing wedge angle θ. The maximum $\sigma_{xx}$ for the wedge with 170° is 0.089 $p_0$ on the top surface, but the maximum $\sigma_{xx}$ reaches 0.41 $p_0$ for quarter-space. The compressive stress on the top surface 20 decreases with the wedge angle θ. Specially, the compressive stress on the top surface 20 totally changes into tensile stress when the wedge angle θ is <90°. As it would be appreciated by person skilled in the art, this finding would be reasonable given the lack of enough support under the top surface 20 for such wedge structure 10 with angle θ<90°.

Turning now to the normal stress $\sigma_{xx}$ inside the contact body 10, the trend can be separated into two parts. For wedges with angle θ>90°, the area of compressive stress shrinks to the apex of the wedge 10 with decreasing wedge angle θ. However, the area of compressive stress increases under the load area with the wedge angle θ decreasing from 90°. Furthermore, the compressive stress along the free surface decreases slightly with depth for the wedge with 60°.

The stresses $\sigma_{yy}$ are totally compressive when the wedge angle θ is >90°. However, tensile stress appears next to the free surface when the wedge 10 is small enough, such as the wedge θ with 60°. Additionally, the effect of wedge angle θ on $\sigma_{yy}$ in the corner is apparent. The gradient of $\sigma_{yy}$ at the corner drops gradually with the decrease in wedge angle θ from 170° to 90°. However, this trend is reversed once the wedge angle θ reaches below 90°. A similar finding was observed for normal stress $\sigma_{zz}$.

In one specific example embodiment, the analytical method 100 in the present invention is adopted for determining the stress and strain of an object 10 with two identical loads being applied onto the top 20 and edge surfaces 30 with a wedge angle θ there between simultaneously.

For instance, a pair of normal load distributions, represented in the following Equation (40), is applied to the top surface 20 and the edge surface 30 respectively:

$$p(x_1, y_1) = p_0 \frac{\sqrt{a^2 - (x_1-a)^2 - y_1^2}}{a}, \sqrt{(x_1-a)^2 + y_1^2} \le a \quad (40)$$
$$p(x_1, y_1) = 0, \sqrt{(x_1-a)^2 + y_1^2} > a$$

Figure 13A:
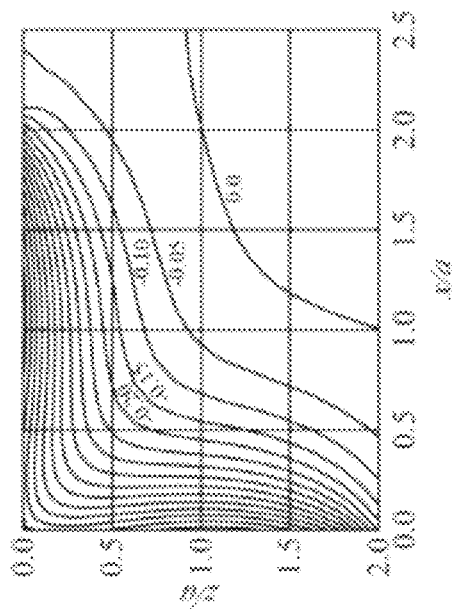
FIG. 13a is an illustration showing the normal stress distribution $\sigma_{zz}$ in the Y=0 plane of a 90° wedge under two half-semispherical distributed loads on $X_1$-$Y_1$ plane and $X_2$-$Y_2$ plane.
Figure 13B:
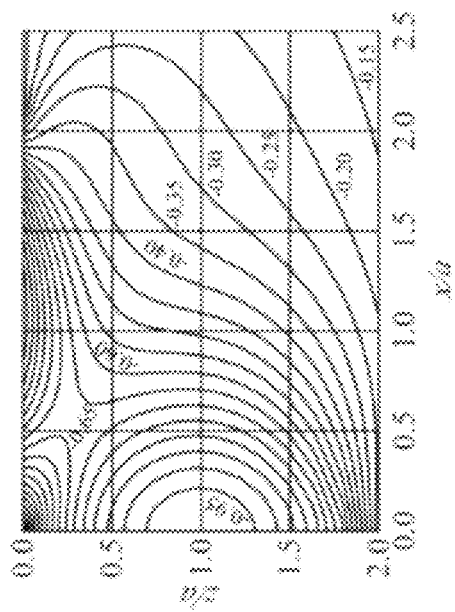
FIG. 13b is an illustration showing the normal stress distribution $\sigma_{yy}$ in the Y=0 plane of a 90° wedge under two half-semispherical distributed loads on $X_1$-$Y_1$ plane and $X_2$-$Y_2$ plane.

The normal and shear stresses on y=0 plane are presented in FIGS. 13*a* to 13*b* respectively (step 106). In detail, the maximum modulus of $\sigma_{xx}/p_0$ is 1.0 and just locates at (0, 0, 1.0), which is the centre of the side semispherical surface load.

Figure 13C:
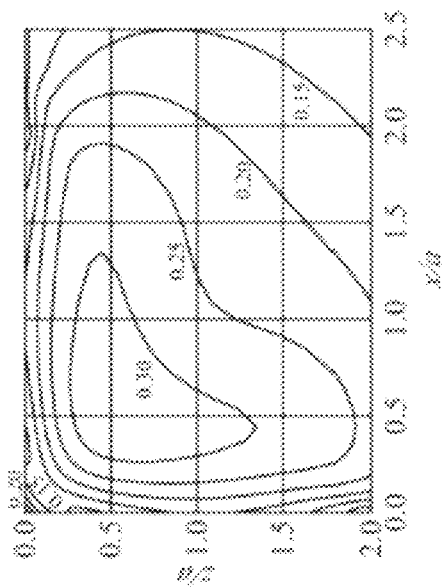
FIG. 13c is an illustration showing the von Mises stress in the Y=0 plane of a 90° wedge under two half-semispherical distributed loads on $X_1$-$Y_1$ plane and $X_2$-$Y_2$ plane.

As the current wedge problem is symmetrical about the plane x1-z1, it would be appreciated by person skilled in the art that the result of $\sigma_{zz}$ would also be depicted by FIG. 13(*a*). The distribution of $\sigma_{yy}$ in y=0 plane is symmetrical about x1-z1 (as shown in FIG. 13*b*). Accordingly, the maximum stress of the object 10 is determined to be present at (0.5, 0, 0.5), as shown in FIG. 13*c*.

Advantageously, the method in the present invention requires only the two side surfaces 20 and 30 of the wedge structure 10 is meshed into rectangular grids. Therefore, it is much simpler and more suitable to study the wedge problems with varying surface loads.

Furthermore, the transformation matrix provide in the present invention is only related to the wedge angle θ, mesh structure and the elastic properties of object 10 but not the applied load p. The transformation matrix can be determined and saved in advance for subsequent calculations with different loads p, q. Therefore, the explicit matrix method is suitable to be embedded into those studies requiring iterative calculations of wedge deformation or stress, such as the elastohydrodynamic lubrication analysis of roller bearings.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An analytical method of determining the stress and strain of an object with a plurality of planar surfaces under one or more applied loads, comprising the steps of:
   A. applying three dimensional loads on each of the plurality of planar surfaces simultaneously;
   B. determining the three dimensional equivalent loads applied on each of the plurality of planar surfaces from the applied three dimensional loads with the stress boundary conditions;
   C. determining the stress and strain fields induced on each of the plurality of planar surfaces by the equivalent load applied on the other plurality of planar surfaces; and
   D. determining the stress and strain associated with the mechanical failure of the object;
   wherein step B includes determining a transformation matrix associated with the physical characteristics of the object and in turn the equivalent load from the applied load;
   wherein each of the plurality of planar surfaces is divided into a plurality of uniformly loaded sections each having a centre respectively;
   wherein each centre of the uniformly loaded sections on the plurality of planar surfaces $X_1$-$Y_1$ and $X_2$-$Y_2$ is represented by $x_{1i}$, $y_{1i}$ and $x_{2i}$, $y_{2i}$ respectively; and
   wherein the parameter of the applied load $P_1$, $Q_{x1}$, $Q_{y1}$ applied on each of the plurality of planar surfaces $X_i$-$Y_1$ and the parameter of the applied load $p_2$, $Q_{x2}$, $Q_{y2}$, applied on each of the plurality of planar surfaces $X_2$-$Y_2$ are each represented in the form of the accumulation of uniform loads p, q applied on each uniformly loaded section by the following expression respectively:

$$P_1 = \begin{bmatrix} (p_1)_1 \\ (p_1)_2 \\ \vdots \\ (p_1)_k \end{bmatrix}; Q_{X1} = \begin{bmatrix} (q_{x1})_1 \\ (q_{x1})_2 \\ \vdots \\ (q_{x1})_k \end{bmatrix}; Q_{Y2} = \begin{bmatrix} (q_{y1})_1 \\ (q_{y1})_2 \\ \vdots \\ (q_{y1})_k \end{bmatrix}$$

$$P_2 = \begin{bmatrix} (p_2)_1 \\ (p_2)_2 \\ \vdots \\ (p_2)_l \end{bmatrix}; Q_{X2} = \begin{bmatrix} (q_{x2})_1 \\ (q_{x2})_2 \\ \vdots \\ (q_{x2})_l \end{bmatrix}; Q_{Y2} = \begin{bmatrix} (q_{y2})_1 \\ (q_{y2})_2 \\ \vdots \\ (q_{y2})_l \end{bmatrix}$$

where the value of each uniform load p, q on the uniformly loaded section is represented by the value at the center $(x_{1i}, y_{1i})$, $(x_2, y_2)$ of the section respectively:
$(p_1)_i = p_1(x_{1i}, y_{1i})$, $(q_{x1})_i = q_{x1}(x_{1i}, y_{1i})$, $(q_{y1})_i = q_{y1}(x_{1i}, y_{1i})$; and
$(p_2)_i = p_2(x_{2i}, y_{2i})$, $(q_{x2})_i = q_{x2}(x_{2i}, y_{2i})_i = q_{y2}(x_{2j}, y_{2j})$.

2. The analytical method according to claim 1, wherein the applied load includes the accumulation of uniform loads applied on each uniformly loaded section.

3. The analytical method according to claim 1, wherein the equivalent load includes the accumulation of uniform equivalent loads applied on each uniformly loaded section.

4. The analytical method according to claim 1, wherein the induced stress includes the accumulation of stresses induced on the centre of each uniformly loaded section.

5. The analytical method according to claim 1, wherein the transformation matrix is associated with the predetermined size of the uniformly loaded section.

6. An analytical method of determining the stress and strain of an object with a plurality of planar surfaces under one or more applied loads, comprising the steps of:
   A. applying three dimensional loads on each of the plurality of planar surfaces simultaneously;
   B. determining the three dimensional equivalent loads applied on each of the plurality of planar surfaces from the applied three dimensional loads with the stress boundary conditions;

C. determining the stress and strain fields induced on each of the plurality of planar surfaces by the equivalent load applied on the other plurality of planar surfaces; and D. determining the stress and strain associated with the mechanical failure of the object;

wherein step B includes determining a transformation matrix associated with the physical characteristics of the object and in turn the equivalent load from the applied load;

wherein each of the plurality of planar surfaces is divided into a plurality of uniformly loaded sections each having a centre respectively;

wherein each centre of the uniformly loaded sections on the plurality of planar surfaces $X_1$-$Y_1$ and $X_2$-$Y_2$ is represented by $x_{1i}$, $y_{1i}$ and $x_{2i}$, $y_{2i}$ respectively; and wherein the parameter of the equivalent load $\overline{P}_1$, $\overline{Q}_{X1}$, $\overline{Q}_{Y1}$ applied on the plurality of planar surfaces $X_1$-$Y_1$ and the parameter of the equivalent load $\overline{P}_2$, $\overline{Q}_{X2}$, $\overline{Q}_{Y2}$ applied on the plurality of planar surfaces $X_2$-$Y_2$ are each represented in the form of the accumulation of equivalent loads $\overline{P}$, $\overline{Q}$ applied on each of uniformly loaded section by the following expression respectively:

$$\overline{P}_1 = \begin{bmatrix} (\overline{p}_1)_1 \\ (\overline{p}_1)_2 \\ \vdots \\ (\overline{p}_1)_k \end{bmatrix}; \overline{Q}_{X1} = \begin{bmatrix} (\overline{q}_{x1})_1 \\ (\overline{q}_{x1})_2 \\ \vdots \\ (\overline{q}_{x1})_k \end{bmatrix}; \overline{Q}_{Y1} = \begin{bmatrix} (\overline{q}_{y1})_1 \\ (\overline{q}_{y1})_2 \\ \vdots \\ (\overline{q}_{y1})_k \end{bmatrix}$$

$$\overline{P}_2 = \begin{bmatrix} (\overline{p}_2)_1 \\ (\overline{p}_2)_2 \\ \vdots \\ (\overline{p}_2)_l \end{bmatrix}; \overline{Q}_{X2} = \begin{bmatrix} (\overline{q}_{x2})_1 \\ (\overline{q}_{x2})_2 \\ \vdots \\ (\overline{q}_{x2})_l \end{bmatrix}; \overline{Q}_{Y2} = \begin{bmatrix} (\overline{q}_{y2})_1 \\ (\overline{q}_{y2})_2 \\ \vdots \\ (\overline{q}_{y2})_l \end{bmatrix}$$

where the value of each uniform equivalent load $\overline{p}$, $\overline{q}$ on the uniformly loaded section is represented by the value at the center $(x_{1i}, y_{1i})$, $(x_2 y_2)$ of the section respectively:

$(\overline{p}_1)_i = \overline{p}_1(x_{1i}, y_{1i})$, $(\overline{q}_{x1})_i = \overline{q}_{x1}(x_{1i}, y_{1i})$, $(\overline{q}_{y1})_i = \overline{q}_{y1}(x_{1i}, y_{1i})$; and $(\overline{p}_2)_i = \overline{p}_2(x_{2i}, y_{2i})$, $(\overline{q}_{x2})_i = \overline{q}_{x2}(x_{2i}, y_{2i})$, $(\overline{q}_{y2})_i = \overline{q}_{y2}(x_{2j}, y_{2j})$.

7. The analytical method according to claim 6, wherein the applied load includes the accumulation of uniform loads applied on each uniformly loaded section.

8. The analytical method according to claim 6, wherein the equivalent load includes the accumulation of uniform equivalent loads applied on each uniformly loaded section.

9. The analytical method according to claim 6, wherein the induced stress includes the accumulation of stresses induced on the centre of each uniformly loaded section.

10. The analytical method according to claim 6, wherein the transformation matrix is associated with the predetermined size of the uniformly loaded section.

11. The analytical method according to claim 6, wherein equivalent load $\overline{P}_1$, $\overline{Q}_{X1}$, $\overline{Q}_{Y1}$ and equivalent load $\overline{P}_2$, $\overline{Q}_{X2}$, $\overline{Q}_{Y2}$ are determined from the following expression:

$$\begin{bmatrix} \overline{P}_1 \\ \overline{Q}_{X1} \\ \overline{Q}_{Y1} \\ \overline{P}_2 \\ \overline{Q}_{X2} \\ \overline{Q}_{Y2} \end{bmatrix} = \begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1} \begin{bmatrix} P_1 \\ Q_{X1} \\ Q_{Y1} \\ P_2 \\ Q_{X2} \\ Q_{Y2} \end{bmatrix}$$

where the inverse matrix is the transformation matrix;

$M_{ZZ}$, $M_{ZX}$, $M_{ZY}$, $M_{XZ}$, $M_{XX}$, $M_{XY}$, $M_{YZ}$, $M_{YX}$, $M_{YY}$ are the two dimensional matrices of coefficients for stress calculation using classical half-space formulae based on equivalent loads on planar surface $X_1$-$Y_1$;

$N_{ZZ}$, $N_{ZX}$, $N_{ZY}$, $N_{XZ}$, $N_{XX}$, $N_{XY}$, $N_{YZ}$, $N_{YX}$, $N_{YY}$ are the two dimensional matrices of coefficients for stress calculation using classical half-space formulae based on equivalent loads on planar surface $X_2$-$Y_2$;

$P_1$, $Q_{X1}$, $Q_{Y1}$ are the loads applied on planar surface $X_1$-$Y_1$; and $P_Z$, $Q_{XZ}$, $Q_{YZ}$ are the loads applied on planar surface $X_2$-$Y_2$.

12. An analytical method of determining the stress and strain of an object with a plurality of planar surfaces under one or more applied loads, comprising the steps of:

A. applying three dimensional loads on each of the plurality of planar surfaces simultaneously;

B. determining the three dimensional equivalent loads applied on each of the plurality of planar surfaces from the applied three dimensional loads with the stress boundary conditions;

C. determining the stress and strain fields induced on each of the plurality of planar surfaces by the equivalent load applied on the other plurality of planar surfaces; and D. determining the stress and strain associated with the mechanical failure of the object;

wherein step B includes determining a transformation matrix associated with the physical characteristics of the object and in turn the equivalent load from the applied load; and wherein the transformation matrix is represented by a plurality of two dimensional coefficients $M_{ZZ}$, $M_{ZX}$, $M_{ZY}$, $M_{XZ}$, $M_{XX}$, $M_{YZ}$, $M_{YX}$, $M_{YY}$ and $N_{ZZ}$, $N_{ZX}$, $N_{ZY}$, $N_{XZ}$, $N_{XX}$, $N_{XY}$, $N_{YZ}$, $N_{YX}$, $N_{YY}$ respectively in the form of $$\begin{bmatrix} I & 0 & 0 & -N_{ZZ} & -N_{ZX} & -N_{ZY} \\ 0 & I & 0 & -N_{XZ} & -N_{XX} & -N_{XY} \\ 0 & 0 & I & -N_{YZ} & -N_{YX} & -N_{YY} \\ -M_{ZZ} & -M_{ZX} & -M_{ZY} & I & 0 & 0 \\ -M_{XZ} & -M_{XX} & -M_{XY} & 0 & I & 0 \\ -M_{YZ} & -M_{YX} & -M_{YY} & 0 & 0 & I \end{bmatrix}^{-1}, \text{ and}$$

wherein $M_{ZZ}$, $M_{ZX}$, $M_{ZY}$, $M_{XZ}$, $M_{XX}$, $M_{XY}$, $M_{YZ}$, $M_{YX}$, $M_{YY}$ and $N_{ZZ}$, $N_{ZX}$, $N_{ZY}$, $N_{XZ}$, $N_{XX}$, $N_{XY}$, $N_{YZ}$, $N_{YX}$, $N_{YY}$ are each represented in the form of the accumulation of coefficients of each uniformly loaded section by the following expression respectively:

$$M_{ZZ} = \begin{bmatrix} m_{zz11} & m_{zz21} & \cdots & m_{zzk1} \\ m_{zz12} & m_{zz22} & \cdots & m_{zzk2} \\ \vdots & \vdots & \ddots & \vdots \\ m_{zz1l} & m_{zz2l} & \cdots & m_{zzkl} \end{bmatrix}$$

-continued $$M_{ZX} = \begin{bmatrix} m_{zx11} & m_{zx21} & \cdots & m_{zxk1} \\ m_{zx12} & m_{zx22} & \cdots & m_{zxk2} \\ \vdots & \vdots & \ddots & \vdots \\ m_{zx1l} & m_{zx2l} & \cdots & m_{zxkl} \end{bmatrix}$$

$$\vdots$$

$$M_{YY} = \begin{bmatrix} m_{yy11} & m_{yy21} & \cdots & m_{yyk1} \\ m_{yy12} & m_{yy22} & \cdots & m_{yyk2} \\ \vdots & \vdots & \ddots & \vdots \\ m_{yy1l} & m_{yy2l} & \cdots & m_{yykl} \end{bmatrix}$$

$$N_{ZZ} = \begin{bmatrix} n_{zz11} & n_{zz21} & \cdots & n_{zzl1} \\ n_{zz12} & n_{zz22} & \cdots & n_{zzl2} \\ \vdots & \vdots & \ddots & \vdots \\ n_{zz1k} & n_{zz2k} & \cdots & n_{zzlk} \end{bmatrix}$$

$$N_{ZX} = \begin{bmatrix} n_{zx11} & n_{zx21} & \cdots & n_{zxl1} \\ n_{zx12} & n_{zx22} & \cdots & n_{zxl2} \\ \vdots & \vdots & \ddots & \vdots \\ n_{zx1k} & n_{zx2k} & \cdots & n_{zxlk} \end{bmatrix}$$

$$\vdots$$

$$N_{YY} = \begin{bmatrix} n_{yy11} & n_{yy21} & \cdots & n_{yyl1} \\ n_{yy12} & n_{yy22} & \cdots & n_{yyl2} \\ \vdots & \vdots & \ddots & \vdots \\ n_{yy1k} & n_{yy2k} & \cdots & n_{yylk} \end{bmatrix}.$$

13. The analytical method according to claim 12, wherein the physical characteristic includes the elastic property of a said object and the relative orientations between the planar surfaces.

14. The analytical method according to claim 12, wherein the transformation matrix includes the accumulation of coefficients used in the classical formulae for half-space stress and strain calculations.

15. The analytical method according to claim 12, wherein the parameter of the induced stress $S_Z$, $S_X$, $S_Y$ induced by the equivalent load $\overline{P}_Z$, $\overline{Q}_{XZ}$, $\overline{Q}_{YZ}$ on the plurality of planar surfaces $X_2$-$Y_2$ and the parameter of the induced stress $T_Z$, $T_X$, $T_Y$ induced by the equivalent load $\overline{P}_1$, $\overline{Q}_{X1}$, $\overline{Q}_{Y1}$ on the plurality of planar surfaces $X_1$-$Y_1$ are each represented in the form of the accumulation of stresses $\sigma$, $\tau$ induced on the centre of each uniformly loaded section by the following expression respectively:

$$S_Z = \begin{bmatrix} (\sigma_{zz2})_1 \\ (\sigma_{zz2})_2 \\ \vdots \\ (\sigma_{zz2})_l \end{bmatrix}; S_X = \begin{bmatrix} (\tau_{zx2})_1 \\ (\tau_{zx2})_2 \\ \vdots \\ (\tau_{zx2})_l \end{bmatrix}; S_Y = \begin{bmatrix} (\tau_{zy2})_1 \\ (\tau_{zy2})_2 \\ \vdots \\ (\tau_{zy2})_l \end{bmatrix}$$

$$T_Z = \begin{bmatrix} (\sigma_{zz1})_1 \\ (\sigma_{zz1})_2 \\ \vdots \\ (\sigma_{zz1})_k \end{bmatrix}; T_X = \begin{bmatrix} (\tau_{zx1})_1 \\ (\tau_{zx1})_2 \\ \vdots \\ (\tau_{zx1})_k \end{bmatrix}; T_Y = \begin{bmatrix} (\tau_{zy1})_1 \\ (\tau_{zy1})_2 \\ \vdots \\ (\tau_{zy1})_k \end{bmatrix}$$

where the value of each stresses $\sigma$, $\tau$ on the centre of each uniformly loaded section is represented by the value at the center $(x_{1i}, y_{1i})$, $(x_2, y_2$ of the section respectively: $(\sigma_{zz2})_i = \sigma_{zz2}(x_{2i}, y_{2i})$, $(\tau_{zx2})_i = \tau_{zx2}(x_{2i}, y_{2i})$, $(\tau_{zy2})_i = \tau_{zy2}(x_{2j}, y_{2j})$; and
$(\sigma_{zz1})_i = \sigma_{zz1}(x_{1i}, y_{1i})$, $(\tau_{zx1})_i = \tau_{zx1}(x_{1i}, y_{1i})$, $(\tau_{zy1})_i = \tau_{zy1}(x_{1i}, y_{1i})$.

16. The analytical method according to claim 15, wherein the parameter of the induced stress $S_Z$, $S_X$, $S_Y$ induced on the plurality of planar surfaces $X_2$-$Y_2$ and the parameter of the induced stress $T_Z$, $T_Z$, $T_Y$ induced on the plurality of planar surfaces $X_1$-$Y_1$ are each determined from the following expressions respectively:

$$S_Z = M_{ZZ} \cdot \overline{P}_1 + M_{ZX} \cdot \overline{Q}_{X1} + M_{ZY} \cdot \overline{Q}_{Y1}$$

$$S_X = M_{XZ} \cdot \overline{P}_1 + M_{XX} \cdot \overline{Q}_{X1} + M_{XY} \cdot \overline{Q}_{Y1}$$

$$S_Y = M_{YZ} \cdot \overline{P}_1 + M_{YX} \cdot \overline{Q}_{X1} + M_{YY} \cdot \overline{Q}_{Y1}$$

$$T_Z = N_{ZZ} \cdot \overline{P}_2 + N_{ZX} \cdot \overline{Q}_{X2} + N_{ZY} \cdot \overline{Q}_{Y2}$$

$$T_X = N_{XZ} \cdot \overline{P}_2 + N_{XX} \cdot \overline{Q}_{X2} + N_{XY} \cdot \overline{Q}_{Y2}$$

$$T_Y = N_{YZ} \cdot \overline{P}_2 + N_{YX} \cdot \overline{Q}_{X2} + N_{YY} \cdot \overline{Q}_{Y2}$$

where
$M_{ZZ}$, $M_{ZX}$, $M_{XY}$, $M_{XZ}$, $M_{XX}$, $M_{YY}$, $M_{YZ}$, $M_{YX}$, $M_{YY}$ and $N_{ZZ}$, $N_{ZX}$, $N_{ZY}$, $N_{XZ}$, $N_{XX}$, $N_{XY}$, $N_{YZ}$, $N_{YX}$, $N_{YY}$ are two dimensional coefficients.

* * * * *